(12) United States Patent
Mcgehee et al.

(10) Patent No.: US 10,568,224 B2
(45) Date of Patent: Feb. 18, 2020

(54) SOFTWARE-CONFIGURABLE MULTI-FUNCTION RF MODULE

(71) Applicant: RAYTHEON COMPANY, Waltham, MA (US)

(72) Inventors: William K. Mcgehee, Mckinney, TX (US); John Hudlow, Richardson, TX (US); Michael R. Patrizi, Allen, TX (US); Tuan M. Tong, Frisco, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/587,332

(22) Filed: May 4, 2017

(65) Prior Publication Data
US 2018/0324967 A1 Nov. 8, 2018

(51) Int. Cl.
*H05K 5/02* (2006.01)
*H03F 3/19* (2006.01)
(Continued)

(52) U.S. Cl.
CPC ......... *H05K 5/0256* (2013.01); *H03F 1/0277* (2013.01); *H03F 3/19* (2013.01); *H03F 3/195* (2013.01); *H03F 3/245* (2013.01); *H03F 3/72* (2013.01); *H03H 11/04* (2013.01); *H04B 1/0003* (2013.01); *H04B 1/0053* (2013.01); *H05K 1/111* (2013.01); *H05K 7/14* (2013.01); *H03F 2200/165* (2013.01); *H03F 2200/294* (2013.01); *H03F 2200/451* (2013.01); *H03F 2203/7209* (2013.01);
(Continued)

(58) Field of Classification Search
USPC ......... 375/326, 327; 455/701, 324; 370/311, 370/466
See application file for complete search history.

(56) References Cited

U.S. PATENT DOCUMENTS 3,765,020 A * 10/1973 Seager .................. G01S 7/34
                                                333/81 R
5,128,623 A *  7/1992 Gilmore ................ G06J 1/00
                                                327/107
(Continued)

OTHER PUBLICATIONS

Keller, John, "DARPA RF-FPGA program awards six contracts to develop programmable RF front-ends", Military & Aerospace Electronics, Aug. 30, 2012, 3 pages.
(Continued)

*Primary Examiner* — Wednel Cadeau
(74) *Attorney, Agent, or Firm* — Lewis Roca Rothgerber Christie LLP

(57) ABSTRACT

A configurable radio frequency system. The system includes: a plurality of radio frequency cells connected in a cascade. Each of the radio frequency cells includes an input switch connected to an input of the radio frequency system, an output switch connected to an output of the radio frequency system, and a plurality of elements, each of the elements being connected between the input switch and the output switch. The input switch and the output switch are configured, depending on their respective settings, to cause a radio frequency signal path from an input of the cell to an output of the cell to include one of the elements. The plurality of elements in each cell includes a band pass filter, an attenuator, a through path, an amplifier, and a mixer.

20 Claims, 23 Drawing Sheets

(51) Int. Cl.
  *H05K 1/11* (2006.01)
  *H03H 11/04* (2006.01)
  *H05K 7/14* (2006.01)
  *H03F 1/02* (2006.01)
  *H03F 3/195* (2006.01)
  *H03F 3/24* (2006.01)
  *H03F 3/72* (2006.01)
  *H04B 1/00* (2006.01)

(52) U.S. Cl.
  CPC ............... *H03F 2203/7215* (2013.01); *H03F 2203/7221* (2013.01); *H03F 2203/7236* (2013.01); *H05K 2201/10015* (2013.01); *H05K 2201/10098* (2013.01)

(56) References Cited

U.S. PATENT DOCUMENTS

| | | | | |
|---|---|---|---|---|
| 5,384,805 | A * | 1/1995 | Hawkins | G06F 13/387 370/343 |
| 8,503,965 | B2 | 8/2013 | Buer | |
| 8,774,730 | B1 * | 7/2014 | Chethik | G06F 11/1423 455/67.15 |
| 9,264,093 | B1 | 2/2016 | Martin | |
| 2005/0069056 | A1 * | 3/2005 | Willingham | H04B 1/30 375/327 |
| 2008/0171524 | A1 * | 7/2008 | Heng | H03J 3/28 455/150.1 |
| 2010/0052788 | A1 | 3/2010 | Plaze et al. | |
| 2010/0231321 | A1 * | 9/2010 | Czajkowski | H01P 1/15 333/103 |
| 2014/0266454 | A1 * | 9/2014 | Testi | H03G 3/008 330/284 |

OTHER PUBLICATIONS

Lee, Mike et al., "RF FPGA for 0.4 to 18 GHz DoD Multi-function Systems", Northrop Grumman, Mar. 2013, 5 pages.
International Search Report for corresponding International Application No. PCT/US2018/020770, filed Mar. 2, 2018, International Search Report dated May 8, 2018 and dated May 16, 2018 (4 pgs).
Written Opinion of the International Searching Authority for corresponding International Application No. PCT/US2018/020770, filed Mar. 2, 2018, Written Opinion of the International Searching Authority dated May 16, 2018 (5 pgs.).

* cited by examiner

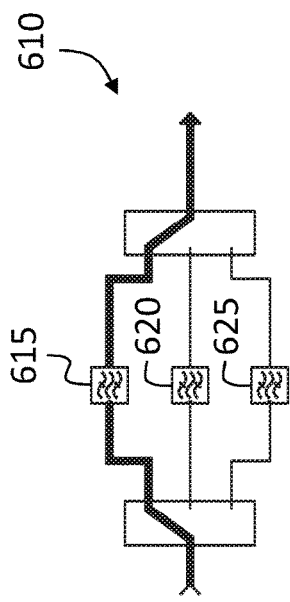
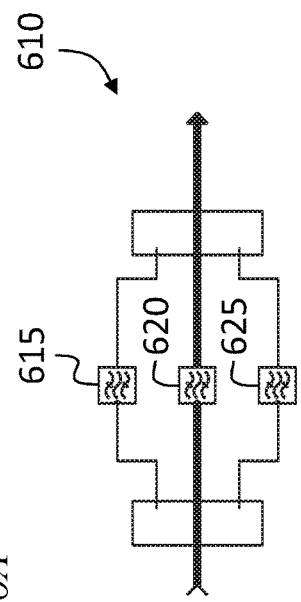
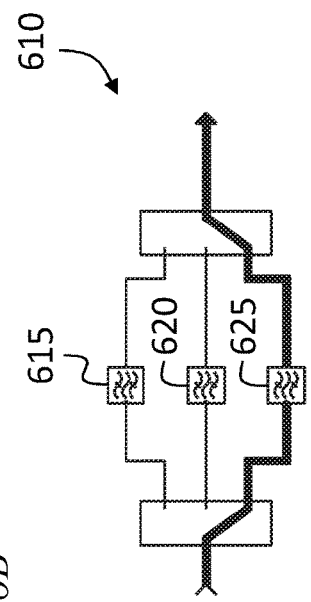
FIG. 6A
FIG. 6B
FIG. 6C

SOFTWARE-CONFIGURABLE MULTI-FUNCTION RF MODULE

FIELD

One or more aspects of embodiments according to the present invention relate to radio frequency (RF) systems, and more particularly to a software-configurable multi-function RF module.

BACKGROUND

A complex radio frequency circuit may include a large number of elements, such as amplifiers, filters, attenuators, and mixers. Although various elements may be repeated within the circuit, circuit design and fabrication may be time-consuming and costly.

Thus, there is a need for an improved system and method for constructing a radio frequency circuit.

SUMMARY

Aspects of embodiments of the present disclosure are directed toward a radio frequency system including a plurality of cells that may be connected in cascade. Each cell includes various different elements, such as a filter, an amplifier, an attenuator, and a mixer. An input switch and an output switch are configured to select which of the elements is connected between the input and the output of the cell. By suitable selection of switch settings, a variety of radio frequency circuits may be formed.

According to an embodiment of the present invention there is provided a radio frequency cell, including: an input switch; an output switch; a first element, the first element being a member of a first functional group; a second element, the second element being a member of a second functional group; and a third element, the third element being a member of a third functional group, the input switch and the output switch being configured, depending on their respective settings, to cause an RF signal path from an input of the radio frequency cell to an output of the radio frequency cell to include one of the first element, the second element, and the third element, each of the first functional group, the second functional group, and the third functional group, being a different group selected from the set consisting of: filters, amplifiers, mixers, frequency multipliers, attenuators, and through paths.

In one embodiment, a system includes: a first radio frequency cell; a second radio frequency cell; and a third radio frequency cell; the first radio frequency cell, the second radio frequency cell, and the third radio frequency cell being connected in a cascade.

In one embodiment, the system includes a field programmable gate array connected to, and configured to control: the input switch of each of the first radio frequency cell, the second radio frequency cell, and the third radio frequency cell; and the output switch of each of the first radio frequency cell, the second radio frequency cell, and the third radio frequency cell.

In one embodiment, the first element of a radio frequency cell of the first radio frequency cell, the second radio frequency cell, and the third radio frequency cell is a mixer, and the radio frequency cell further includes a phase locked loop having an input connected to a reference input of the radio frequency cell and an output connected to a local oscillator input of the mixer.

In one embodiment, the system includes a field programmable gate array connected to, and configured to control, the phase locked loop.

In one embodiment, the system includes a field programmable gate array connected to, and configured to control, the band pass filter.

In one embodiment, the system includes a frequency reference, wherein the first element of each of a plurality of radio frequency cells of the first radio frequency cell, the second radio frequency cell, and the third radio frequency cell is a mixer, and each of the plurality of radio frequency cells further includes a phase locked loop having an input connected to a respective reference input of the radio frequency cell and an output connected to a local oscillator input of the respective mixer of the radio frequency cell, wherein the frequency reference is connected to the reference input of each of the plurality of radio frequency cells.

In one embodiment, the first radio frequency cell includes a bandpass filter having a first passband center frequency, the second radio frequency cell includes a bandpass filter having a second passband center frequency, and the third radio frequency cell includes a bandpass filter having a third passband center frequency, the first, second, and third passband center frequencies all being different.

According to an embodiment of the present invention there is provided a radio frequency system, including: four radio frequency cells connected in a cascade, each of the radio frequency cells including: an input switch connected to an input of the radio frequency cell; an output switch connected to an output of the radio frequency cell; and a plurality of elements, each of the elements being connected between the input switch and the output switch, the input switch and the output switch being configured, depending on their respective settings, to cause an RF signal path from the input of the radio frequency cell to the output of the radio frequency cell to include one of the elements, the plurality of elements including: a band pass filter; an attenuator; a through path; an amplifier; and a mixer.

In one embodiment, the attenuator of one of the four radio frequency cells has a digital control input for controlling the attenuation of the attenuator.

In one embodiment, the band pass filter of one of the four radio frequency cells has a digital control input for controlling the band pass filter.

In one embodiment, a passband center frequency of the band pass filter is controllable through the digital control input.

In one embodiment, a bandwidth of the band pass filter is controllable through the digital control input.

In one embodiment, an order of the band pass filter is controllable through the digital control input.

In one embodiment, the amplifier of one of the four radio frequency cells has a digital control input for controlling the gain of the amplifier.

In one embodiment, each of the four radio frequency cells further includes a phase locked loop having a reference input connected to a reference input of the radio frequency cell and an output connected to a local oscillator input of the mixer of the radio frequency cell.

In one embodiment, the phase locked loop has a digital control input for controlling the ratio of: a frequency at the output of the phase locked loop, to a frequency at the input of the phase locked loop.

In one embodiment, the system includes a field programmable gate array connected to, and configured to control, the input switch and the output switch of each of the four radio frequency cells.

In one embodiment, the system includes a power detector connected to: an output of one of the four radio frequency cells, and the field programmable gate array.

In one embodiment, the system includes a direct conductive connection from a terminal of the output switch to a terminal of the input switch. In one embodiment, this direct conductive connection enables more than one element to be used within the same radio frequency cell.

BRIEF DESCRIPTION OF THE DRAWINGS

Features, aspects, and embodiments are described in conjunction with the attached drawings, in which:

FIG. 6A is a schematic diagram of a parallel filter bank, according to an embodiment of the present invention;

FIG. 6B is a schematic diagram of a parallel filter bank, according to an embodiment of the present invention;

FIG. 6C is a schematic diagram of a parallel filter bank, according to an embodiment of the present invention;

DETAILED DESCRIPTION

The detailed description set forth below in connection with the appended drawings is intended as a description of exemplary embodiments of a software-configurable multi-function RF module provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
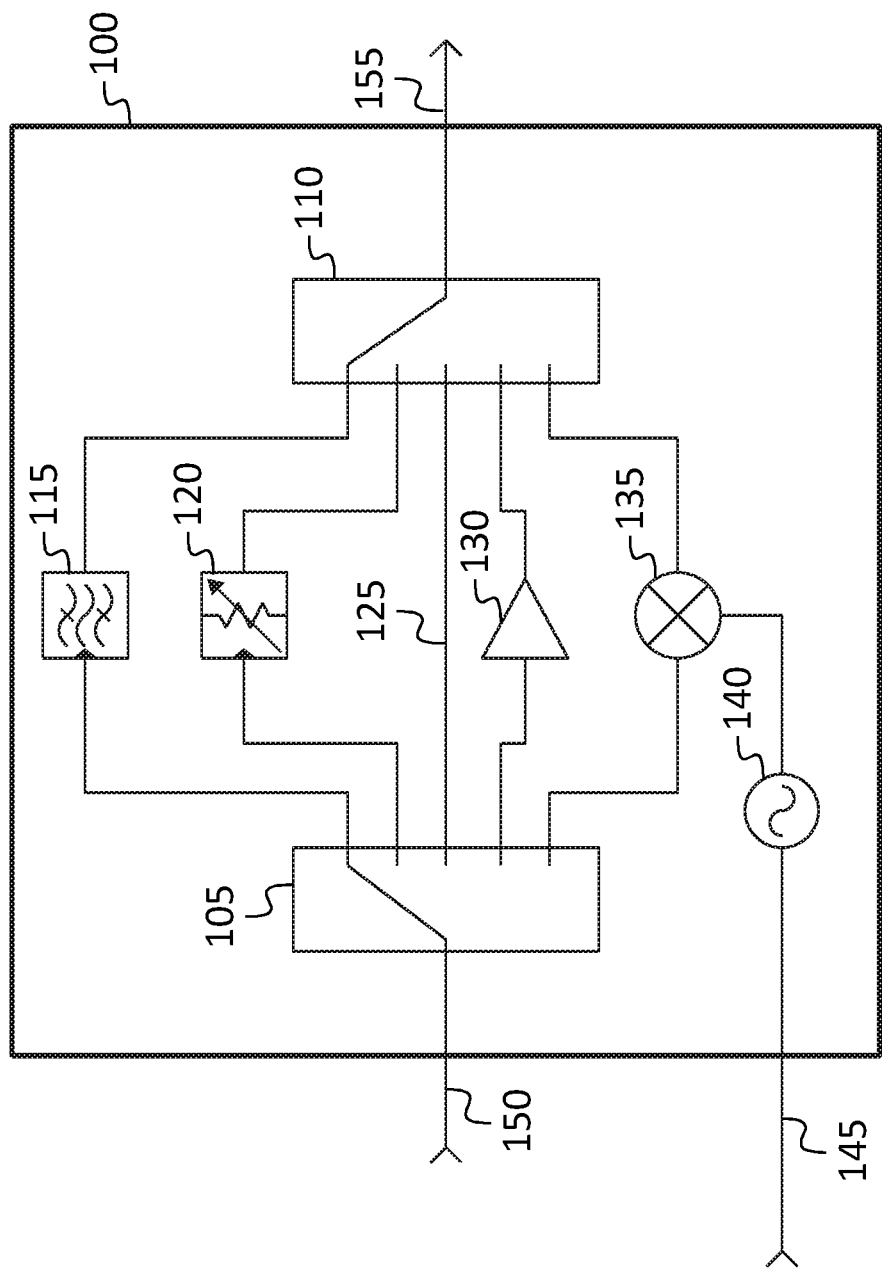
FIG. 1 is a schematic diagram of a radio frequency cell, according to an embodiment of the present invention.

Referring to FIG. 1, in one embodiment, a circuit building block, or "cell" 100, for building radio frequency circuits includes an input switch 105 and an output switch 110, and a plurality of elements between the input switch 105 and the output switch 110, such as (as shown) a bandpass filter 115, a variable attenuator 120, a through path 125, an amplifier 130, and a mixer 135. The local oscillator input of the mixer may be driven by the output of a phase locked loop 140, which may be locked to an externally supplied reference connected to a reference input 145 of the cell. Each element may belong to a respective functional group. A functional group may consist of, for example, amplifiers, attenuators, filters, mixers, or frequency multipliers.

The cell may have an input 150 and an output 155. The input 150 may be connected to the input switch 105, which may be a single pole, N-throw RF switch, e.g., a single-pole 5-throw switch as shown. A single pole, N-throw may have N+1 terminals, including a "common" terminal and N "other" terminals. The common terminal of the input switch 105 may be connected to the input 150 and the other N (e.g., 5) terminals may be connected to N respective paths to the output switch 110, each path being a through path or including one or more elements such as a filter, an attenuator, an amplifier, or a mixer, as shown. The output switch 110 may also be a single pole, N-throw switch, e.g., a single-pole 5-throw switch as shown, with the common terminal connected to the output 155 and the other N (e.g., 5) terminals connected to N respective paths from the input switch 105. The elements may be selected to operate at suitable frequencies, referred to herein as radio frequency (RF). As used herein, the terms "radio frequency" and "RF" is the frequency range from 1 MHz to microwave and millimeter wave frequencies, e.g., up to 300 GHz.

In some embodiments the configuration of the bandpass filter 115 may be controllable, i.e., it may be capable of being controlled, e.g., by a digital control word supplied to a control input of the bandpass filter 115. For example, various characteristics of the bandpass filter 115 may be selectable, including the passband center frequency, the bandwidth, and the order of the bandpass filter 115. The bandpass filter may, for example, be a switched filter bank (as illustrated, for example, in FIGS. 6A-6C).

In some embodiments the amplifier 130 may be a variable gain amplifier, having a gain controlled, e.g., by a digital control word supplied to a control input of the amplifier 130. In some embodiments the cell 100 may include other elements in addition to, or instead of, some of the elements disclosed above and illustrated in FIG. 1, such as a frequency multiplier. As used herein, a "through path" refers to a signal path consisting only of a direct transmission line having a characteristic impedance matched to the input and the output. A through path may have an attenuation of less than 1 dB.

Figure 2:
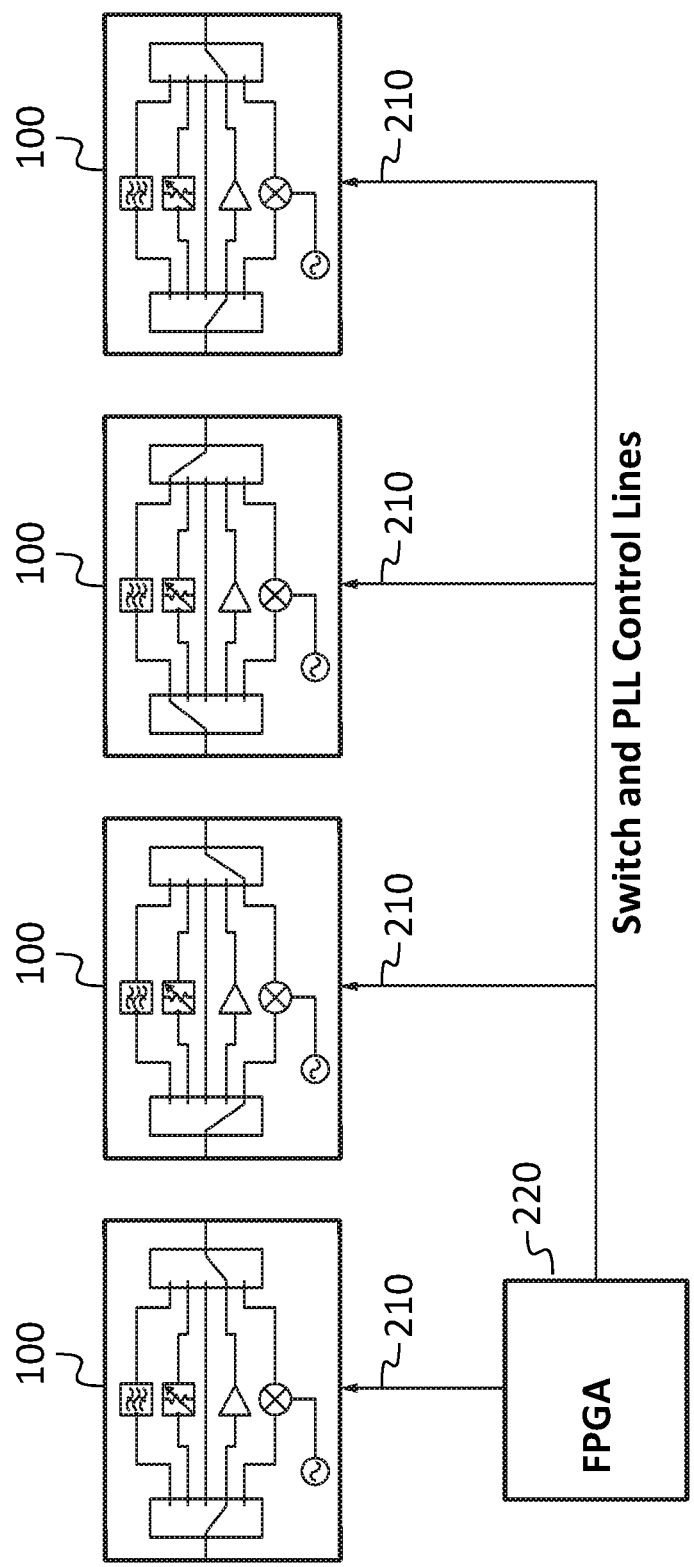
FIG. 2 is a schematic diagram of a plurality of cells controlled by a field programmable gate array, according to an embodiment of the present invention.

Referring to FIG. 2, each cell 100 may have a digital control input 210, (e.g., a serial or parallel digital control input) through which a control circuit, such as a field programmable gate array (FPGA) 220 may control the state of each of the cells 100. The state of each cell may include the setting of the input switch 105 and the setting of the output switch 110 (which may be ganged together, by virtue of a shared control bit, or as a result of the configuration of the FPGA 220), the setting of the variable attenuator, and the setting of the phase locked loop 140. The setting of the attenuator may control the amount of attenuation it provides. The setting of the phase locked loop may include settings (e.g., respective divider ratios) for a feedback path frequency divider and a reference signal frequency divider, which together may be used to set the ratio of the output frequency of the phase locked loop 140 to the frequency of the signal at the reference input.

Figure 3:
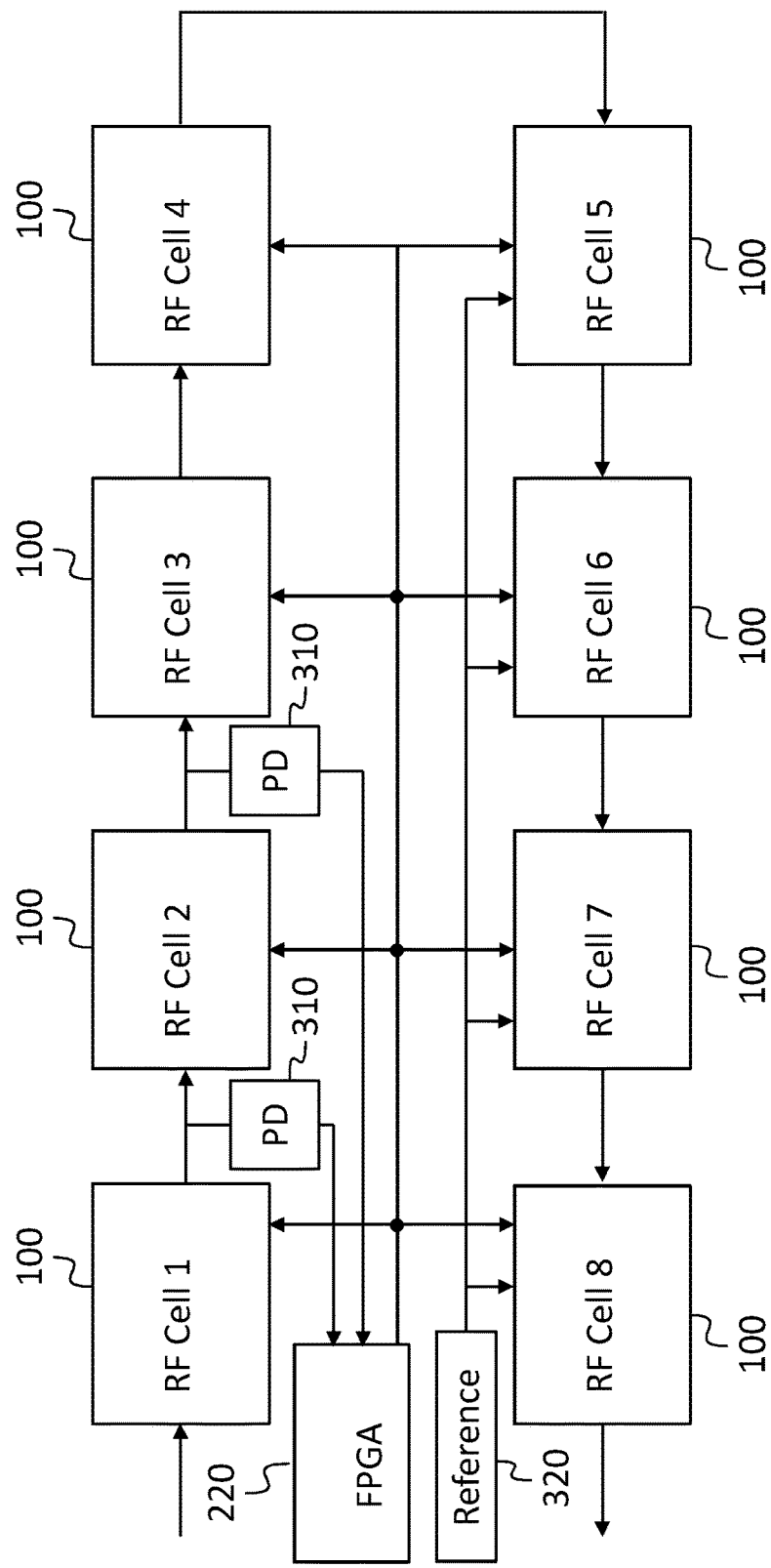
FIG. 3 is a schematic diagram of a plurality of cells controlled by a field programmable gate array, and a shared frequency reference, according to an embodiment of the present invention.

Referring to FIG. 3, in some embodiments a plurality of cells may be laid out along a path that extends, on a printed circuit board (PCB) or "printed wiring board" (PWB), from a connector panel at the front of the board, to the rear of the board, and back to the front of the board. The FPGA may be positioned within the path and a control bus may extend from the FPGA to each of the cells 100 as shown. One or more power detectors 310 may be connected to the RF signal path at the outputs of one or more of the cells 100. In operation, the FPGA may monitor the output of the power detector 310; if the power at the output of one of the cells, as measured by a respective power detector 310, deviates from within a normal range, the FPGA may infer that an element in the cell has failed and reroute the signals to avoid the failed element.

For example, if three cells connected in a cascade are respectively configured to select, in order, an amplifier 130, a through path 125, and a mixer 135, and the power at the output of the cell in which the amplifier 130 is selected drops (i.e., if the power at the output of the first cell drops), indicating that the amplifier 130 of the first cell has failed, the FPGA may command the switches in the first cell 100 to select a through path 125 in the first cell, bypassing the failed amplifier, and to select an amplifier 130 in the second cell, so that the second cell 100 may provide the amplification previously provided by the first cell. FIG. 3 shows two power detectors 310 but in some embodiments the system includes more or fewer power detectors 310.

As mentioned above, a frequency reference 320 may be fed to the reference input 145 of one or more of the cells 100. In FIG. 3 the shared frequency reference 320 is shown connected to four of the cells 100; in some embodiments it is connected more or fewer of the cells 100.

Figure 4B:
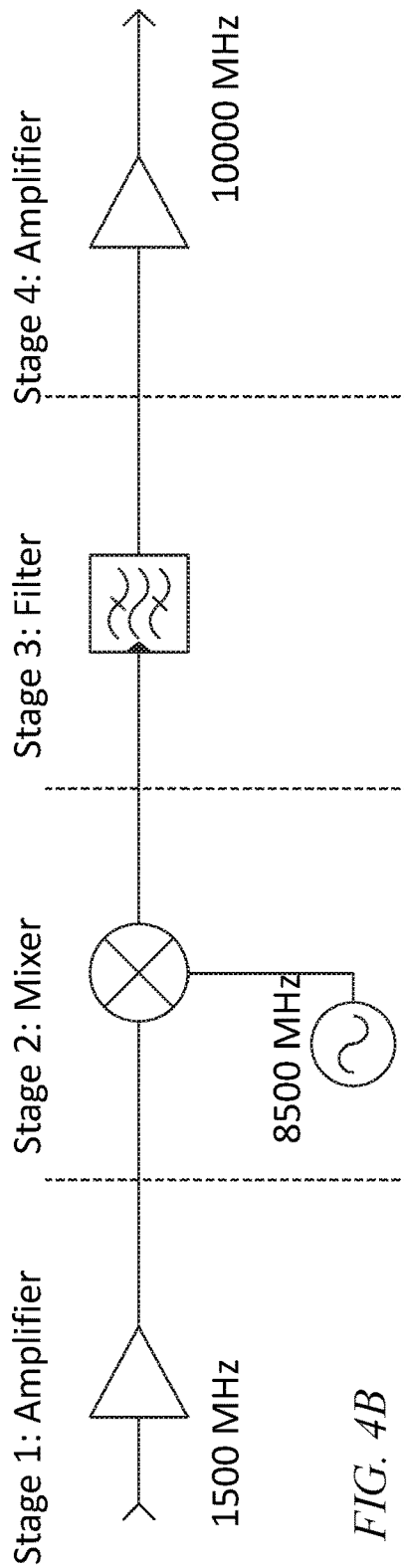
FIG. 4B is a simplified schematic diagram of the transmit channel, according to an embodiment of the present invention.
Figure 4A:
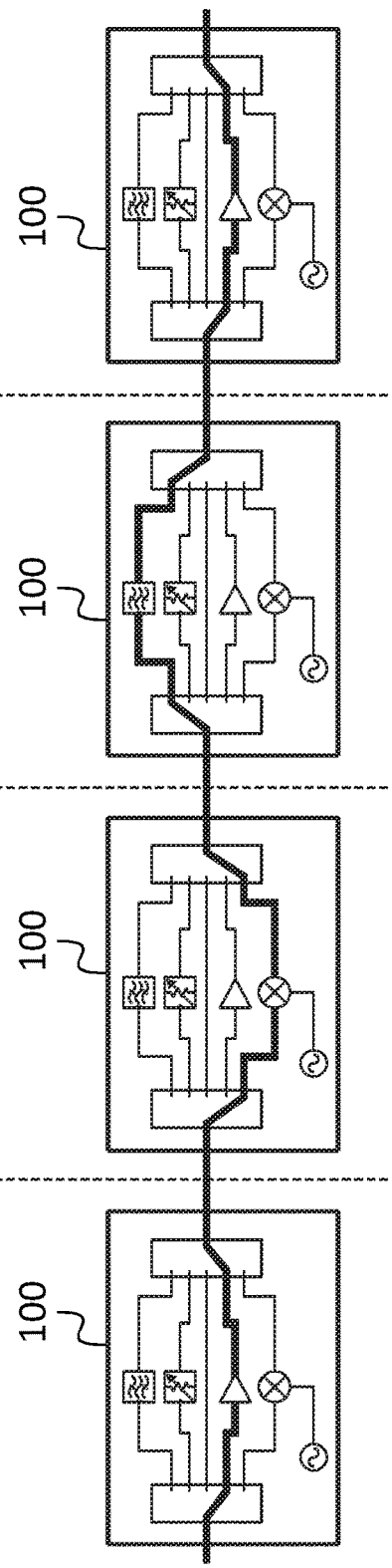
FIG. 4A is a schematic diagram of a plurality of cells configured to implement a transmit channel, according to an embodiment of the present invention.

Referring to FIG. 4A, in one embodiment a cascade of four of the cells 100 of FIG. 1 may be configured by suitable settings of the respective input switches 105 and output switches 110 to implement a transmit channel as shown. The first cell 100 is configured (by suitable settings of the input switch 105 and output switch 110) to select the path through the amplifier 130, the second cell 100 is configured to select the path through the mixer 135, the third cell 100 is configured to select the path through the bandpass filter 115, and the fourth cell 100 is configured to select the path through the amplifier 130. Accordingly, an input signal is routed through the amplifier 130 of the first cell 100, through the mixer 135 of the second cell 100, through the bandpass filter 115 of the third cell 100, and through the amplifier 130 of the fourth cell 100. The cascade of cells, with these switch settings, forms a cascade of four stages as illustrated in FIG. 4B, including a first stage that is an amplifier stage, a second stage that is a mixer stage, a third stage that is a filter stage, and a fourth stage that is an amplifier stage. Such a cascade may be employed as a transmit channel, and if the input frequency is 1500 MHz and the frequency of the phase locked loop 140 of the second cell 100 is 8500 MHz, the output frequency may be 10000 MHz.

Figures 5A, 5B:
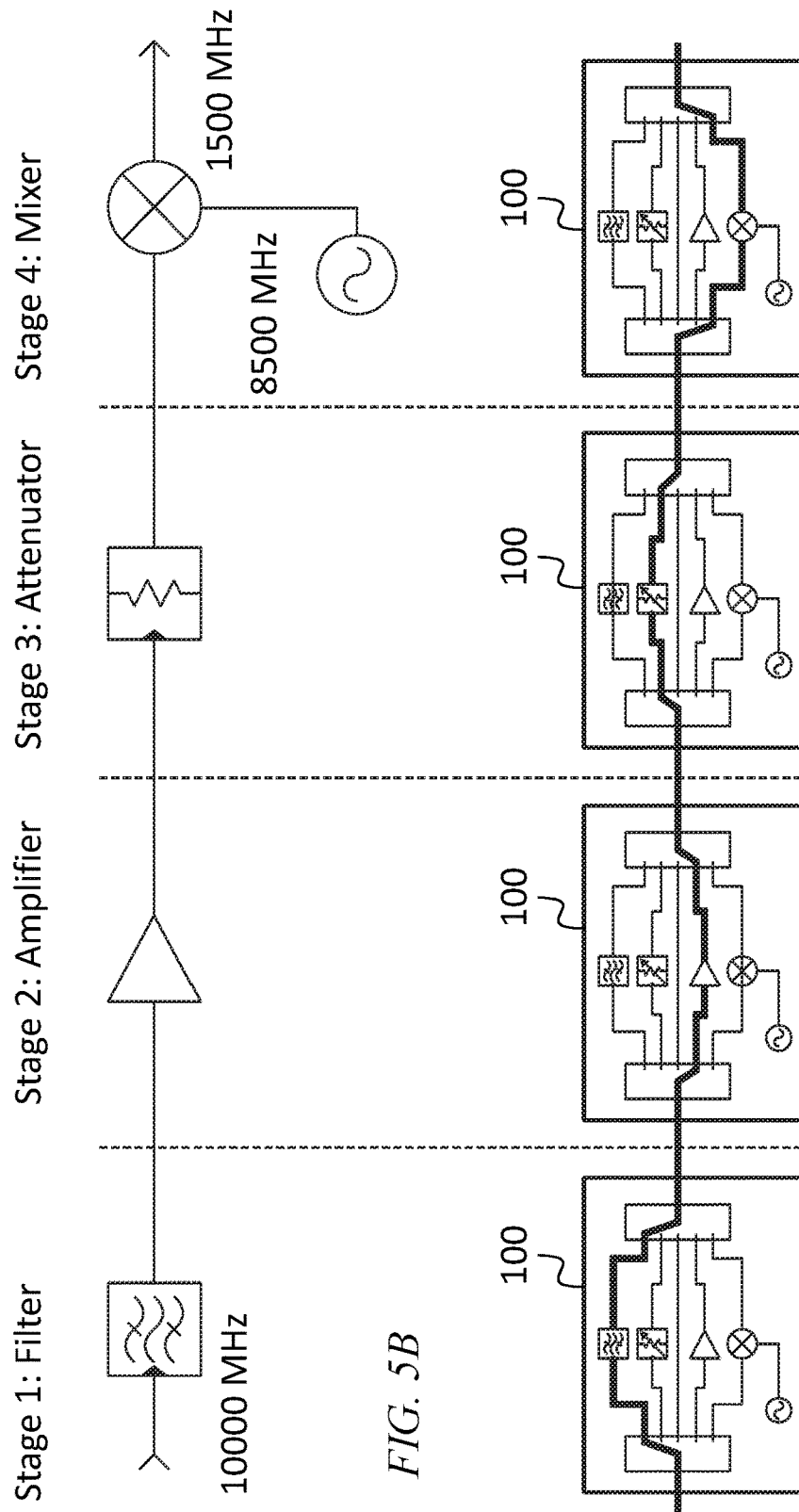
FIG. 5A is a schematic diagram of a plurality of cells configured to implement a receive channel, according to an embodiment of the present invention.
FIG. 5B is a simplified schematic diagram of the receive channel, according to an embodiment of the present invention.

Referring to FIG. 5A, the same cascade of four cells 100 may be reconfigured by changing the switch settings and setting the phase locked loop 140 of the fourth cell, to implement a receive channel. The first cell 100 is configured (by suitable settings of the input switch 105 and output switch 110) to select the path through the bandpass filter 115, the second cell 100 is configured to select the path through the amplifier 130, the third cell 100 is configured to select the path through the variable attenuator 120, and the fourth cell 100 is configured to select the path through the mixer 135. Accordingly, an input signal is routed through the bandpass filter 115 of the first cell 100, through the amplifier 130 of the second cell 100, through the variable attenuator 120 of the third cell 100, and through the mixer 135 of the fourth cell 100. The cascade of cells, with these switch settings, forms a cascade of four stages as illustrated in FIG. 5B, including a first stage that is a filter stage, a second stage that is an amplifier stage, a third stage that is an attenuator stage, and a fourth stage that is a mixer stage. Such a cascade may be employed as a receive channel, and if the input frequency is 10000 MHz and the frequency of the phase locked loop 140 of the fourth cell 100 is 8500 MHz, the output frequency may be 1500 MHz.

Referring to FIGS. 6A-7C, in some embodiments filter banks may be implemented either using parallel or series configurations. For example, Referring to FIGS. 6A-6C, the cell 610 may include three bandpass filters 615, 620, 625 (having different respective passband center frequencies), a single-pole 3-throw input switch 630 and a single-pole 3-throw output switch 635. The switches may be controlled (e.g., by a control signal generated outside of cell 610) to select one of the three bandpass filters 615, 620, 625, and, accordingly, the cell 610 operates as a filter bank, implementing a band pass filter with a selectable passband center frequency. In some embodiments, cell 610 is used to implement element 115 of FIG. 1.

Figure 7A:
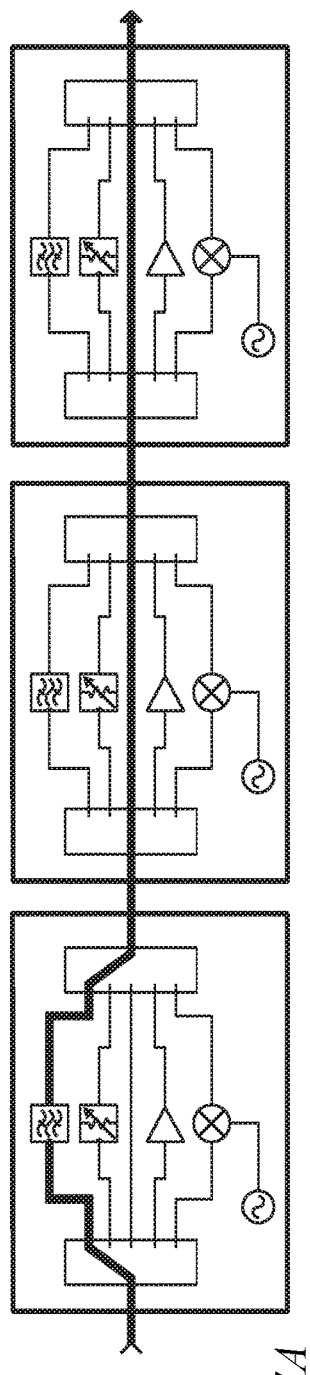
FIG. 7A is a schematic diagram of a plurality of cells implementing a serial filter bank, according to an embodiment of the present invention.
Figure 7B:
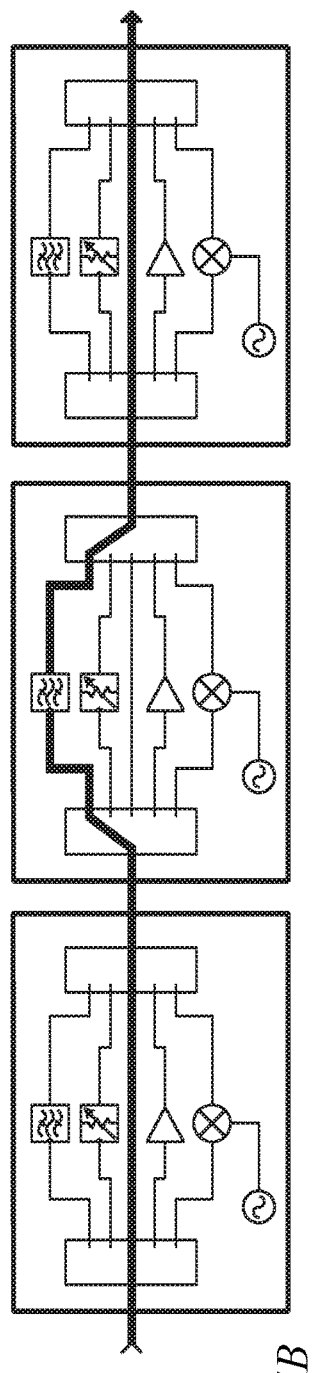
FIG. 7B is a schematic diagram of a plurality of cells implementing a serial filter bank, according to an embodiment of the present invention.
Figure 7C:
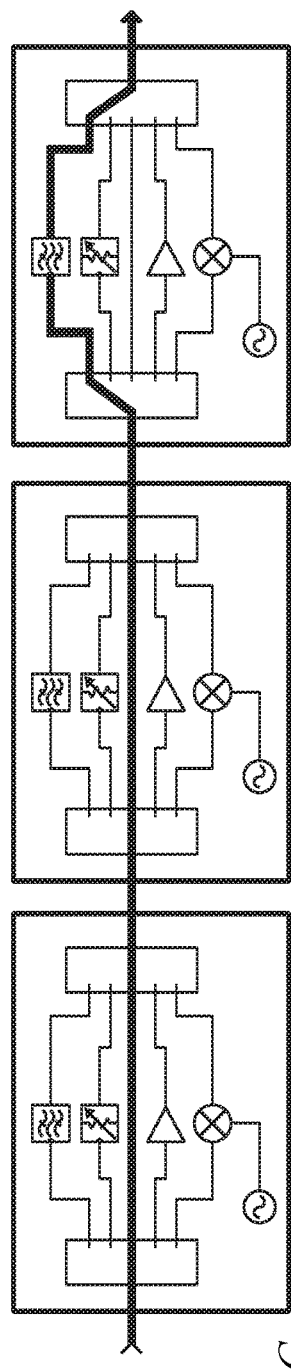
FIG. 7C is a schematic diagram of a plurality of cells implementing a serial filter bank, according to an embodiment of the present invention.

A circuit may also be constructed as illustrated in FIGS. 7A-7C from three of the cells 100 of FIG. 1, with the three cells 100 including three respective bandpass filters 115, each having different passband center frequencies. In a first configuration, illustrated in FIG. 7A, the switches of the three cells 100 are set so that the RF signal propagates through the bandpass filter 115 of the first cell 100 and through the through path 125 of each of the other two cells 100. In a second configuration, illustrated in FIG. 7B, the switches of the three cells 100 are set so that the RF signal propagates through the bandpass filter 115 of the second cell 100 and through the through path 125 of each of the other two cells 100. In a third configuration, illustrated in FIG. 7C, the switches of the three cells 100 are set so that the RF signal propagates through the bandpass filter 115 of the third cell 100 and through the through path 125 of each of the other two cells 100. Accordingly, the circuit of FIGS. 7A-7C also (like the cell 610 of FIGS. 6A-6C) operates as a filter bank, implementing a band pass filter with a selectable passband center frequency. Moreover, the circuit of FIGS. 7A-7C is configurable, by selecting other switch settings, to provide functions instead of, or in addition to, filtering, such as amplifying or attenuating the signal.

Figure 8:
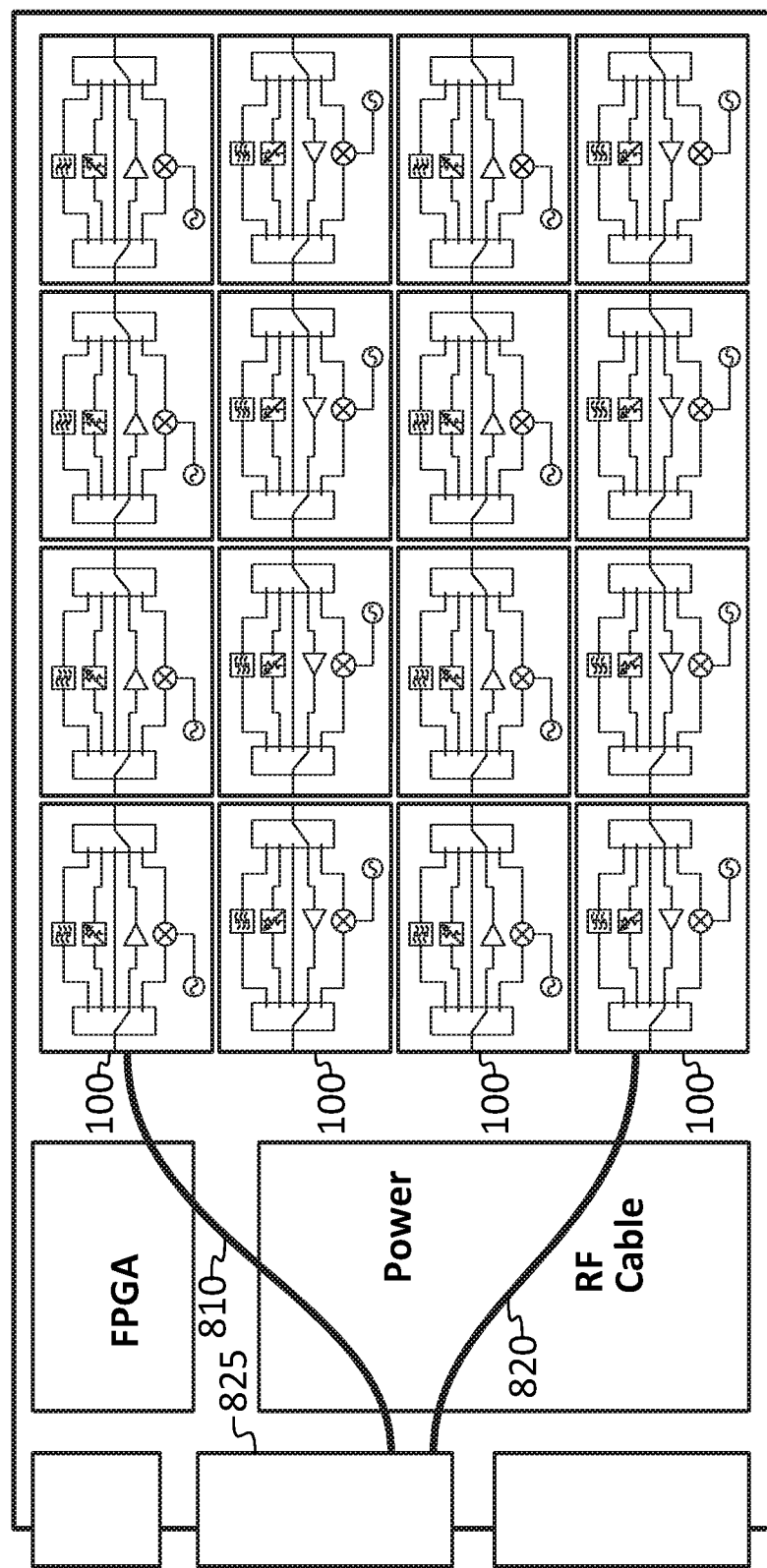
FIG. 8 is an illustration of a printed wiring board including a plurality of cells, according to an embodiment of the present invention.

Referring to FIG. 8, in one embodiment a rectangular array of sixteen cells 100 is shown, each of which may be connected to a successive cell so as to permit a signal to propagate in a serpentine path from left to right in the first and third rows, from right to left in the second and fourth rows, and to the row below from the rightmost cell in the first and third rows and from the leftmost cell in the second row. An input cable 810 may be connected between the upper left cell and an RF connector (or "on-board RF connector") 825 (which may be a VITA67 connector) and an output cable 820 may be connected between the lower left cell and the RF connector. Accordingly the RF signal may propagate in through the input cable 810 and may take a serpentine path through all of the cells 100, and propagate out through an output cable 820.

Figure 9:
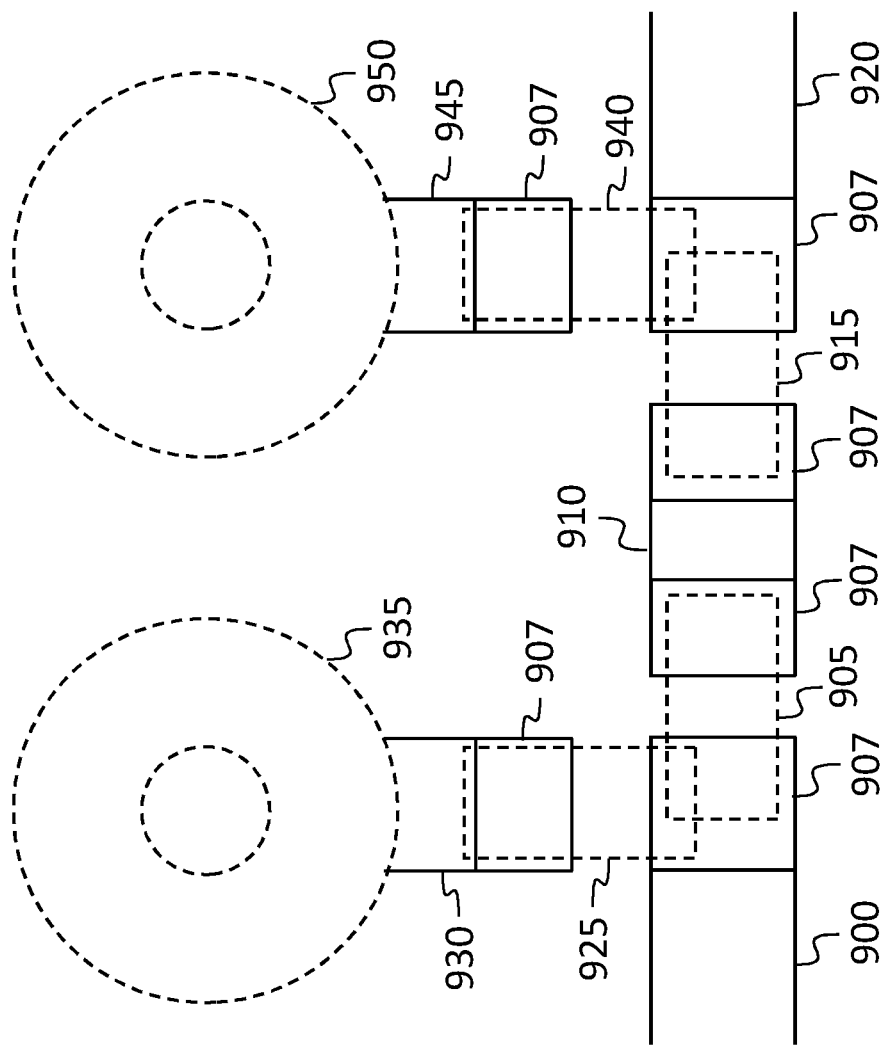
FIG. 9 is a layout diagram of a connection between successive cells, according to an embodiment of the present invention.

Referring to FIG. 9, a first transmission line 900 (e.g., a microstrip transmission line) which may be connected to the output of a first cell 100, may be connected by a first capacitor 905 to a second microstrip transmission line 910, which may be connected by a second capacitor 915 to a third microstrip transmission line 920, which may be connected to the input of a second cell 100. The first capacitor 905 may be a surface-mount "chip" capacitor installed on the printed wiring board by being soldered to two corresponding pads 907 on a printed wiring board, on which the first transmission line 900 and the second microstrip transmission line 910 are fabricated. The first capacitor 905 and the second capacitor 915 are drawn with dashed lines because in some embodiments they are absent. If, instead of the first capacitor 905 being installed, a third capacitor 925 is connected between the first transmission line 900 and a fourth transmission line 930 that is connected to a first radio frequency connector 935, then the radio frequency signal generated by the first cell 100 propagates to the radio frequency connector 935 instead of to the input of the second cell 100. The third capacitor 925 is drawn with dashed lines because in some embodiments it is absent. If, instead of the second capacitor 915 being installed, a fourth capacitor 940 is connected between the third transmission line 920 and a fifth transmission line 945 that is connected to a second radio frequency connector 950, then the second radio frequency connector 950 may be used as an input for a radio frequency signal to the second cell 100. The fourth capacitor 940 is drawn with dashed lines because in some embodiments it is absent. Accordingly, the radio frequency signal at the output of the first cell 100 may then propagate through the first radio frequency connector 935 through a cable to another circuit, or to an antenna or other component and another radio frequency signal may then propagate from another circuit, or from an antenna or other component through the second radio frequency connector 950 through another cable to the input of the second cell 100. The use of capacitors instead of a switch may reduce the loss that a switch (e.g., a switch constructed using transistors) may introduce, if an electronically controlled switch is used.

Figure 10:
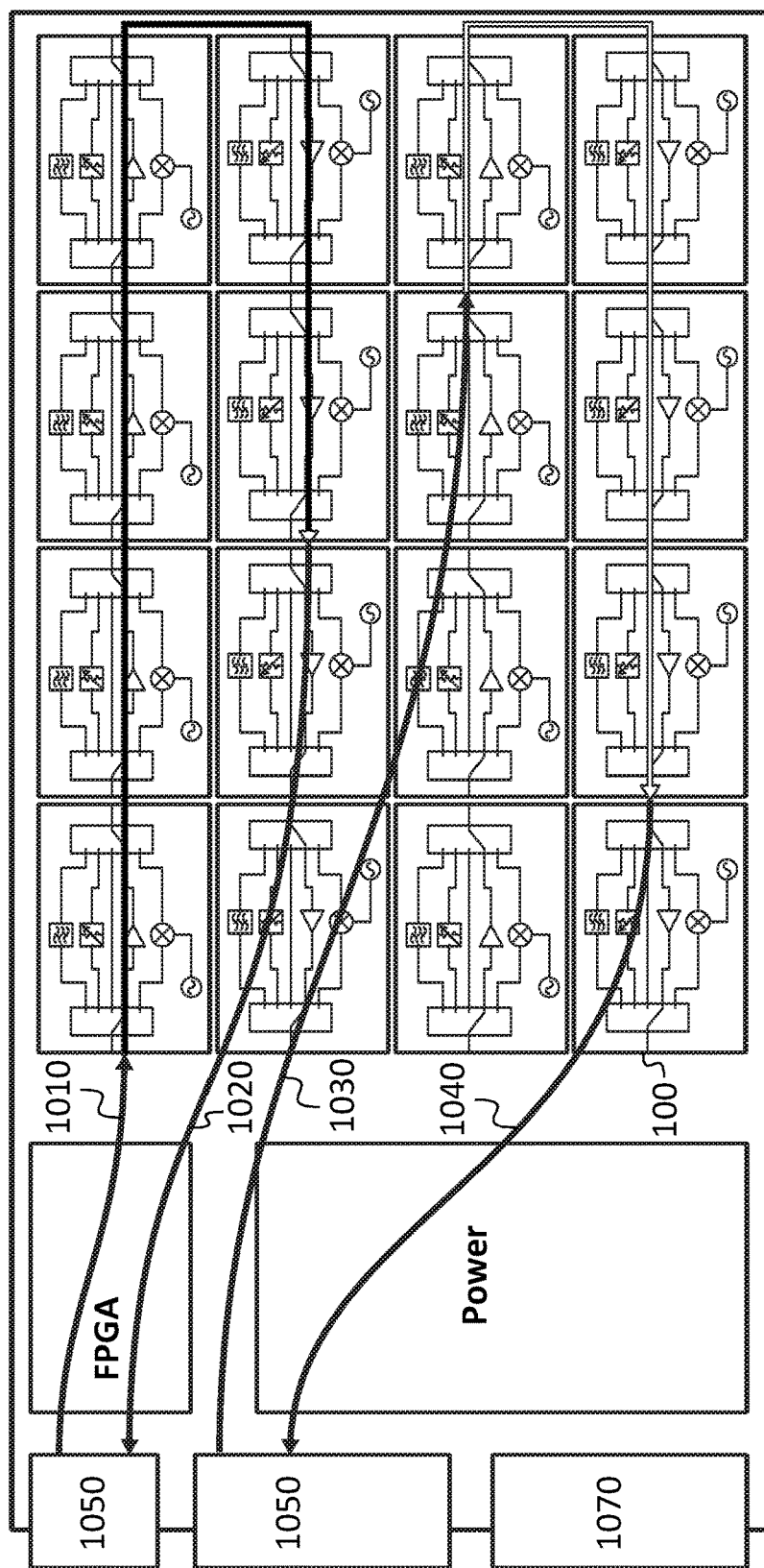
FIG. 10 is an illustration of a printed wiring board including a plurality of cells, according to an embodiment of the present invention.

Referring to FIG. 10, in one embodiment a system for signal routing such as that illustrated in FIG. 9 may be employed between every pair of successive cells 100 in a cascade of cells, and suitable installation of capacitors may then be employed to connect to a subset of the cells in the cascade. For example, in FIG. 10, (if the suitable capacitors, i.e., the first capacitor 905 and the second capacitor 915 in the nomenclature of FIG. 9, are installed and the third capacitor 925 and fourth capacitor 940 in the nomenclature of FIG. 9, are not installed, between pairs of successive cells), the signal may travel, as in the embodiment of FIG. 8, in a serpentine path, except at locations, between successive cells, at which no capacitors have been installed or capacitors have instead been installed to the RF connectors. As shown in FIG. 10, a first pair of cables 1010, 1020 may be used to connect to the input and output of a cascade formed by a subset of the cells 100, consisting of the first through sixth cells of the sixteen cells. The cables 1010, 1020 may connect to one of a plurality of "external" radio frequency connectors 1050 (configured to provide connection points between the radio frequency cells and external components or circuits) of a circuit card 1060 to form a rack-mount unit that may be suitable for installing in an equipment rack. Another connector 1070 may be used to supply power and/or digital data connections to the circuit (e.g., to supply digital data connections to the FPGA). A second pair of cables may also connect to an RF connector 1050, and may be connected respectively to the input of the $11^{th}$ cell 100 and the output of the $15^{th}$ cell 100.

Figure 11:
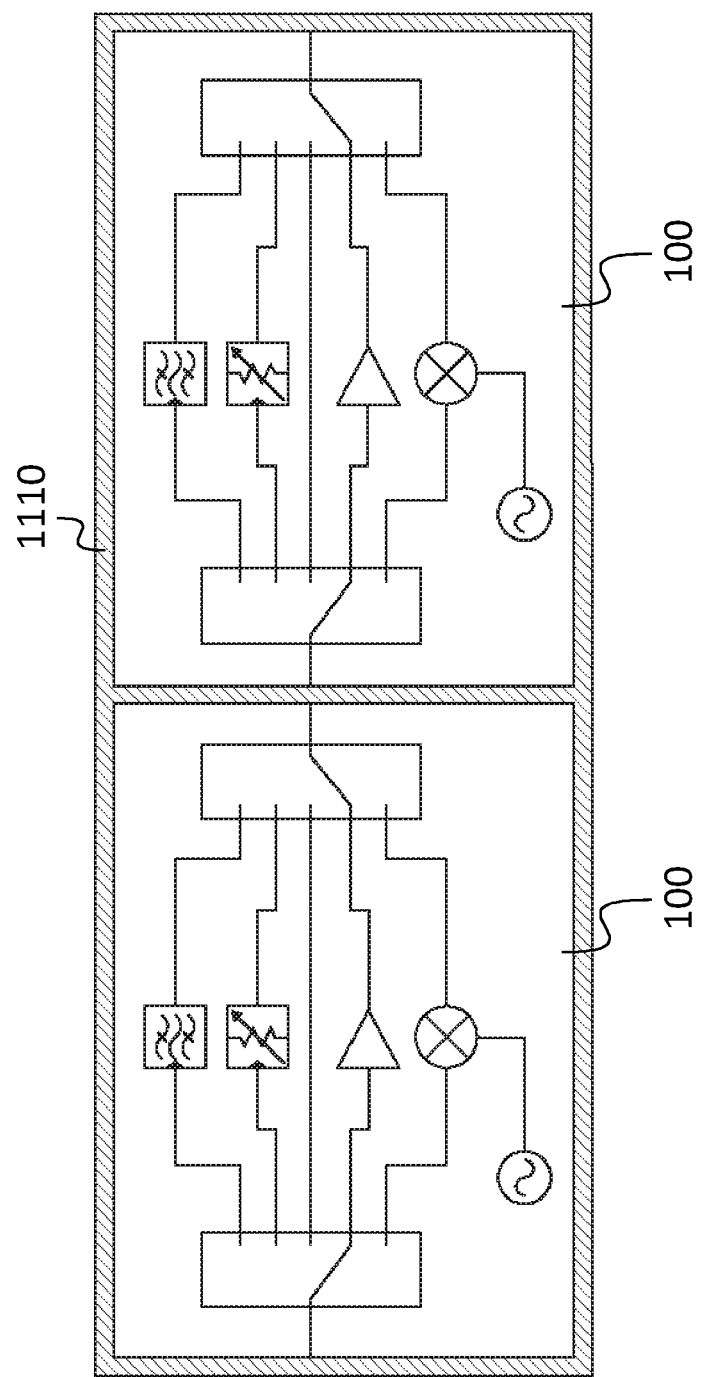
FIG. 11 is a plan view of a system for isolating cells, according to an embodiment of the present invention.

Referring to FIG. 11, in some embodiments two or more cells 100 may be isolated from each other, and/or from other cells 100 by a housing 1110 that may include conductive walls surrounding each module. The housing may be connected to a ground plane of the PWB where the housing contacts the PWB.

Figure 12A:
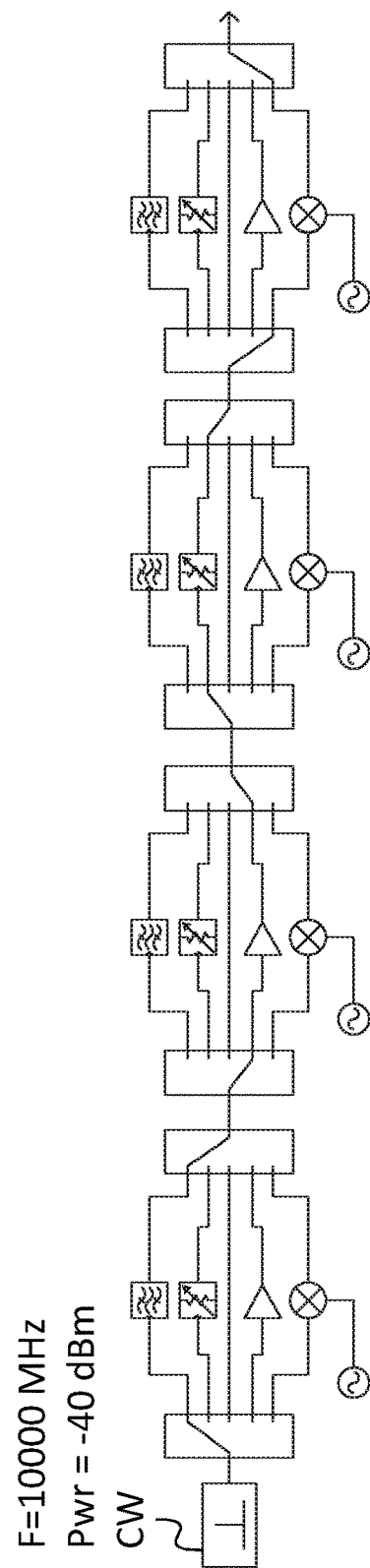
FIG. 12A is a schematic diagram of a plurality of cells configured to implement a receive channel, according to an embodiment of the present invention.
Figure 12B:
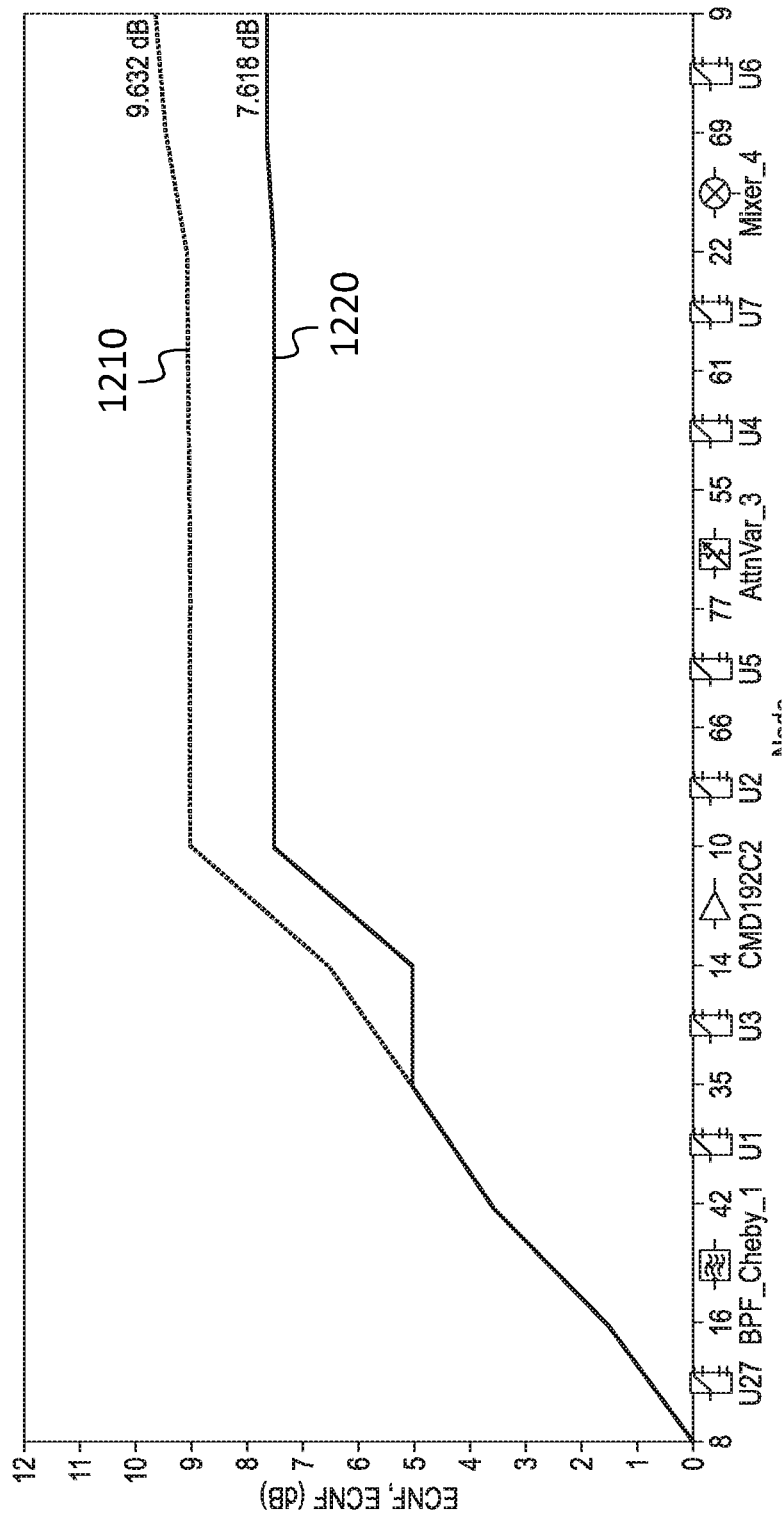
FIG. 12B is a graph of noise figure as a function of position, according to an embodiment of the present invention

Referring to FIGS. 12A and 12B, in some embodiments the receive channel circuit of FIG. 12A may be implemented using a cascade of cells 100 with only a modest effect on the performance of the circuit, compared to a circuit (e.g., that of FIG. 5B) lacking switches and consisting only of the cascade of a filter, an amplifier, an attenuator, and a mixer. FIG. 12B shows the simulated noise figure as a function of position within the circuit, for both (i) (in a first curve 1210) a circuit composed of a cascade of four cells 100 (e.g., FIG. 5A) and (ii) (in a second curve 1220) a circuit composed only of the cascade of a filter, an amplifier, an attenuator, and a mixer, without the switches of a cell 100 (e.g., FIG. 5B). As may be seen from FIG. 12B, the noise performance degradation arising from the inclusion of switches is relatively modest.

Figure 13A:
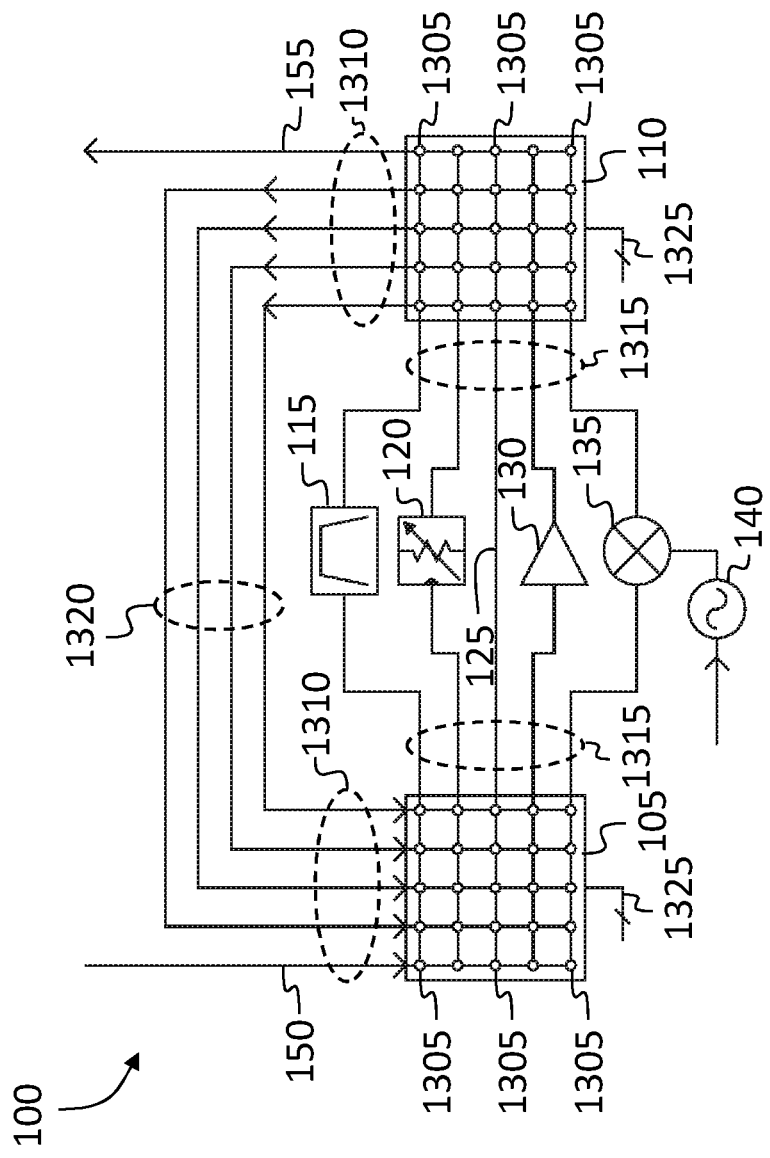
FIG. 13A is a schematic diagram of a radio frequency cell, according to an embodiment of the present invention.

Referring to FIG. 13A, in some embodiments each input switch 105, instead of being a being a single pole, N-throw RF switch, may be a cross-bar switch, i.e., a switch having N first terminals 1310 and M second terminals 1315, and being controllable to connect each of the N first terminals 1310 to any of the M second terminals 1315. In some embodiments, such as the embodiment illustrated in FIG. 13A, N=M. Such a switch may be constructed, for example, as illustrated schematically for the input switch 105 of FIG. 13A, by (i) arranging a first set of N conductors, each connected to a respective one of the first terminals, as vertical lines or wires, and arranging a second set of N conductors, each connected to a respective one of the second terminals, as horizontal lines or wires, each crossing each of the first set of conductors, and (ii) connecting, at each place where two conductors cross, a single-pole single-throw switch 1305 (each such switch being illustrated as a circle in FIG. 13A) between the two conductors. Similarly, each output switch 110 instead of being a being a single pole, N-throw RF switch, may also be a cross-bar switch having N first terminals 1310 and M second terminals 1315, as illustrated in FIG. 13A.

A first one of the first terminals 1310 of the input switch 105 may be the input of the cell 100, and a first one of the first terminals 1310 of the output switch 110 may be the output of the cell 100. Each of the remaining N−1 of the first terminals 1310 of the output switch 110 may be connected via a loopback path 1320 (which may be a conductor, forming a direct conductive connection) to a corresponding one of the remaining N−1 of the first terminals 1310 of the input switch 105. The M second terminals 1315 of the input switch 105 may be connected to M respective paths to the output switch 110, each path being a through path or including one or more elements such as a bandpass filter 115, an attenuator 120, an amplifier 130, or a mixer 135, as shown in FIG. 13A. Each of the input switch 105 and the output switch 110 may have a respective control input 1325 through which the input switch 105 and the output switch 110 may receive respective control signals (e.g., digital control signals, sent over a serial or parallel digital control bus) controlling which of the first terminals 1310 each of the second terminals 1315 is connected to within the switch.

Figure 13B:
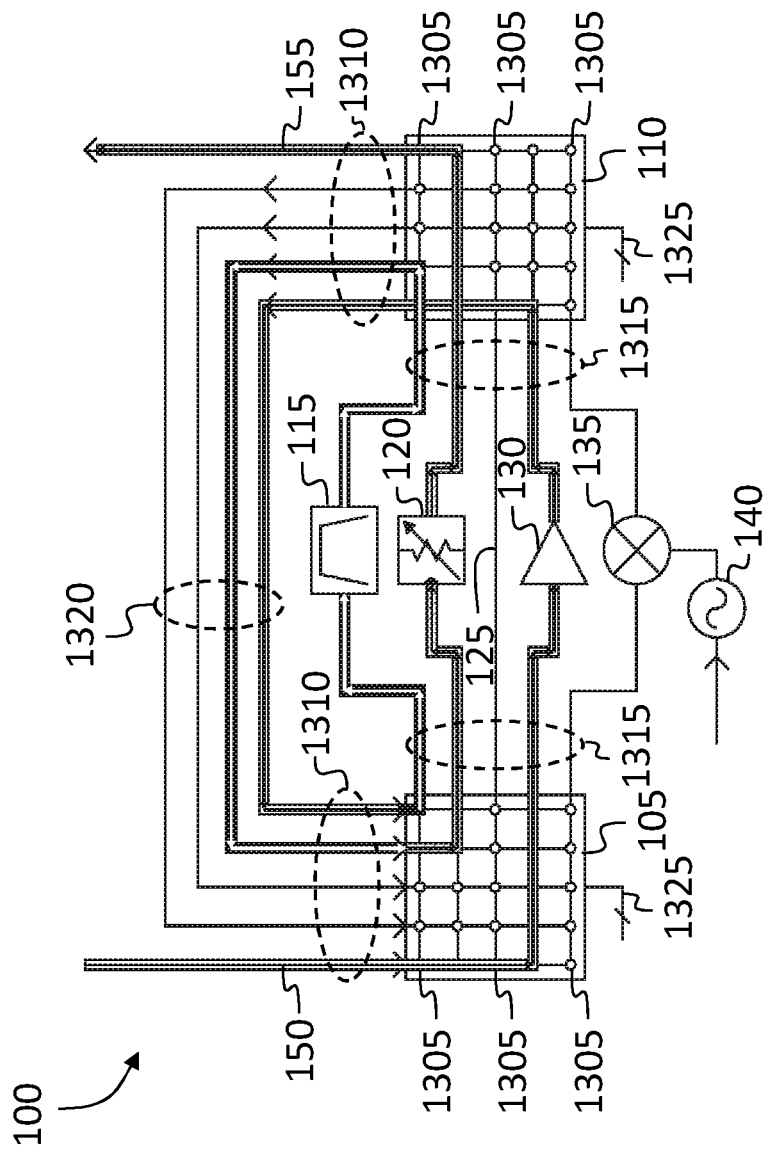
FIG. 13B is a schematic diagram of a radio frequency cell, according to an embodiment of the present invention.

Referring to FIG. 13B, the use of cross-bar switches for the input switch 105 and the output switch 110, and the presence of the loopback paths 1320, may make it possible, by suitable setting of the cross-bar switches, to configure the cell 100 to include a cascade of several elements, i.e., to configure the cell 100 such that a signal propagating into the input 150 of the cell 100 propagates through several of the elements in the cell, one after another, and then propagates out of the output 155 of the cell. In FIG. 13B, the path that such a signal may take is illustrated with heavy lines.

The signal enters the first one of the five first terminals 1310 of the input switch 105, which is configured to connect this conductor to the fourth one of the five second terminals 1315 of the input switch 105. From the fourth second terminal of the five second terminals 1315 of the input switch 105, the signal travels through an amplifier 130, to the fourth second terminal of the five second terminals 1315 of the output switch 110. The output switch 110 is configured to connect the fourth second terminal 1315 of the five second terminals 1315 of the output switch 110 to the fifth first terminal 1310 of the five first terminals 1310 of the output switch 110, from which the signal travels through a fourth loopback path 1320 back to the fifth first terminal 1310 of the five first terminals 1310 of the input switch 105. As is illustrated in FIG. 13B, the signal then travels through the input switch 105 again, through the bandpass filter 115, though the output switch 110, through the third loopback path 1320, through the input switch 105 a third time, through the variable attenuator 120, and through the output switch 110 a third time to the output 155 of the cell 100.

As is illustrated by this example, the cell 100 may be configured, by suitable selection of the configurations of the input switch 105 and the output switch 110, to form a cascade connection of a plurality of the elements in the cell 100, the cascade being, in the example of FIG. 13B, an amplifier 130, followed by a bandpass filter 115, followed by a variable attenuator 120. Cells 100 of the kind illustrated in FIGS. 13A and 13B may then be connected in cascade and controlled, for example by an FPGA, as illustrated in FIG. 3. The FPGA may provide control signals to the respective control inputs 1325 of the input switches 105 and output switches 110 of the cells 100. Power detectors 310 and a shared frequency reference 320 may be connected to a cascade of cells 100 of the kind illustrated in FIG. 13A in the same manner (illustrated, for example, in FIG. 3) as power detectors 310 and a shared frequency reference 320 may be connected to the cells 100 of the kind illustrated in FIG. 1.

Figure 14A:
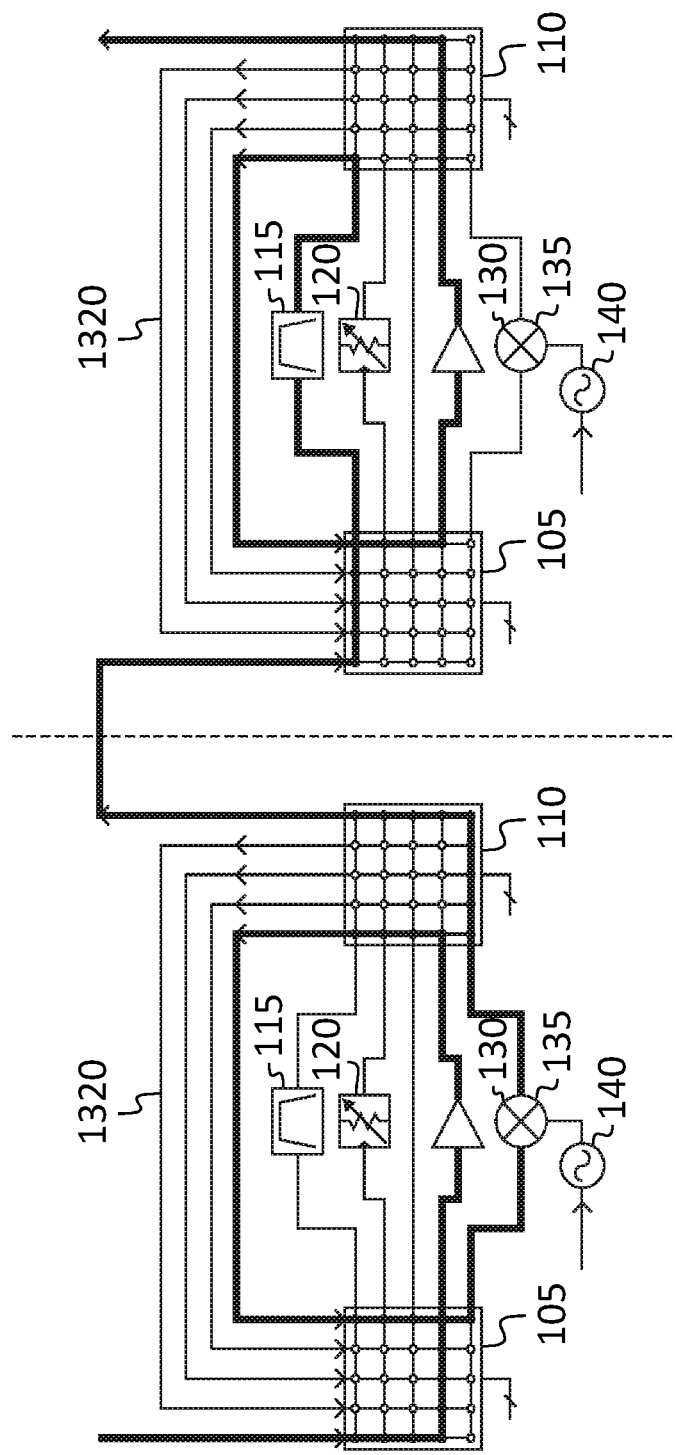
FIG. 14A is a schematic diagram of a cascade of two radio frequency cells, according to an embodiment of the present invention.

Referring to FIG. 14A, in one embodiment, two cells 100 of the kind illustrated in FIG. 13A may be connected in cascade and configured to route the input signal through loopback paths 1320 to form a cascade composed of an amplifier 130, followed by a mixer 135, followed by a bandpass filter 115, followed by another amplifier 130. This cascade has the same elements as the cascade of FIGS. 4A and 4B, i.e., it forms, with two cells 100 of the kind illustrated in FIG. 13A, a circuit that in FIG. 4A is formed using four cells 100 of the kind illustrated in FIG. 1.

Figure 14B:
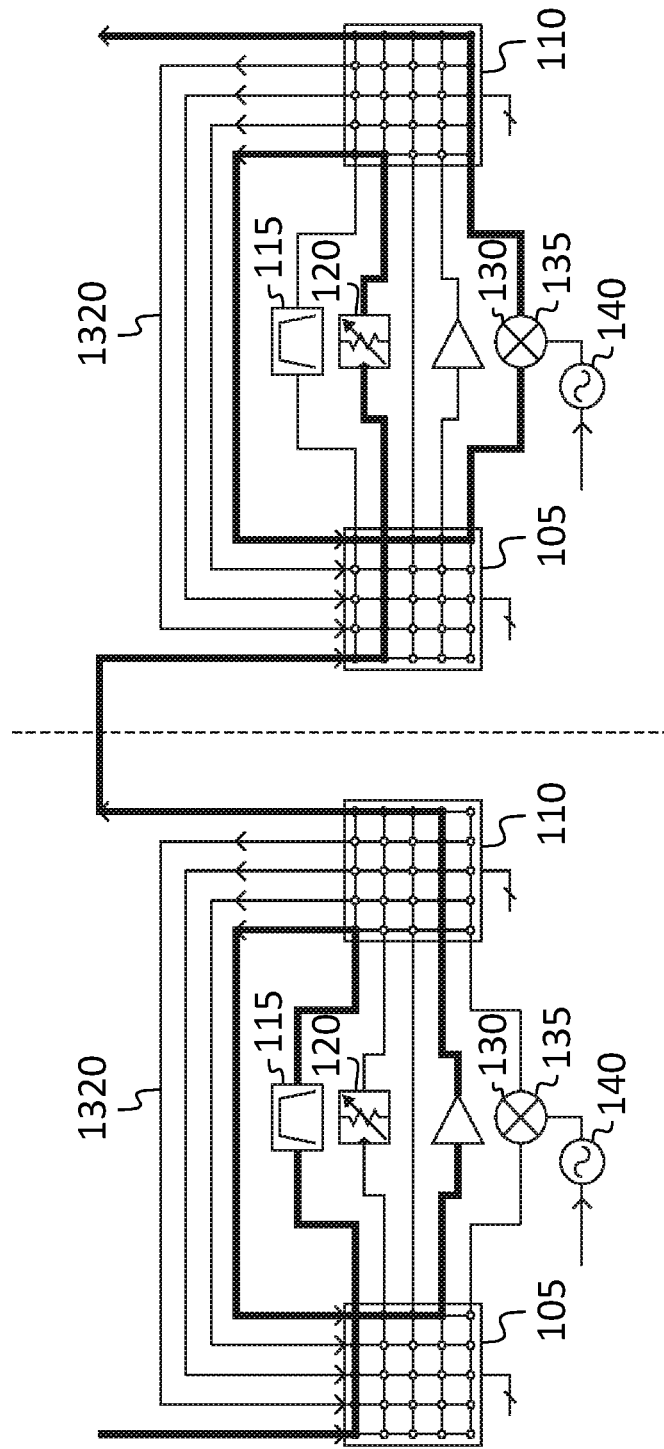
FIG. 14B is a schematic diagram of a cascade of two radio frequency cells, according to an embodiment of the present invention.

Referring to FIG. 14B, in one embodiment, two cells 100 of the kind illustrated in FIG. 13A may be connected in cascade and configured, by settings of the input switch 105 and of the output switch 110 differing from those of FIG. 14A, to route the input signal through loopback paths 1320 to form a cascade composed of a bandpass filter 115, followed by an amplifier 130, followed by a variable attenuator 120, followed by a mixer 135. This cascade has the same elements as the cascade of FIGS. 5A and 5B, i.e., it forms, with two cells 100 of the kind illustrated in FIG. 13A, a circuit that in FIG. 5A is formed using four cells 100 of the kind illustrated in FIG. 1.

Figure 15A:
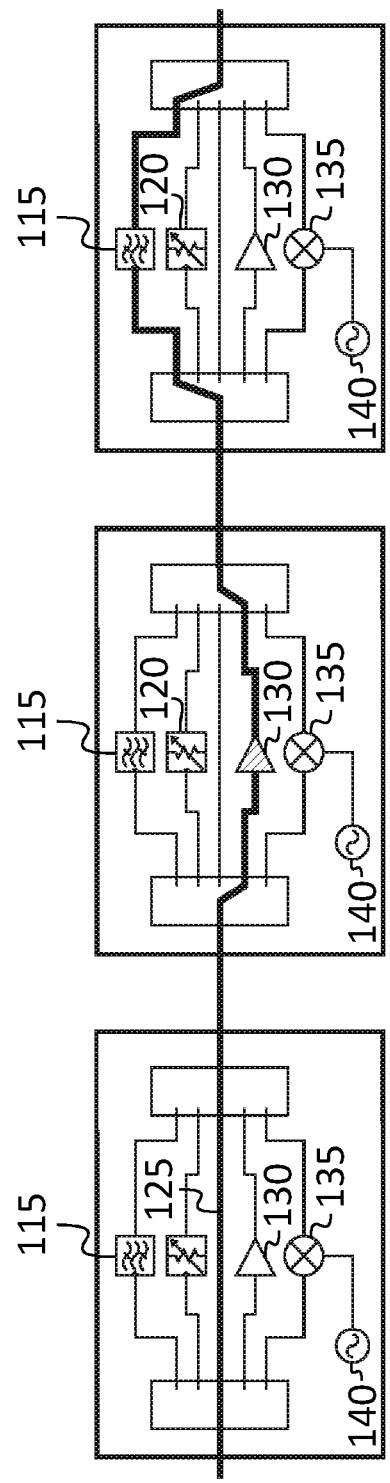
FIG. 15A is a schematic diagram of a cascade of three radio frequency cells, according to an embodiment of the present invention.
Figure 15B:
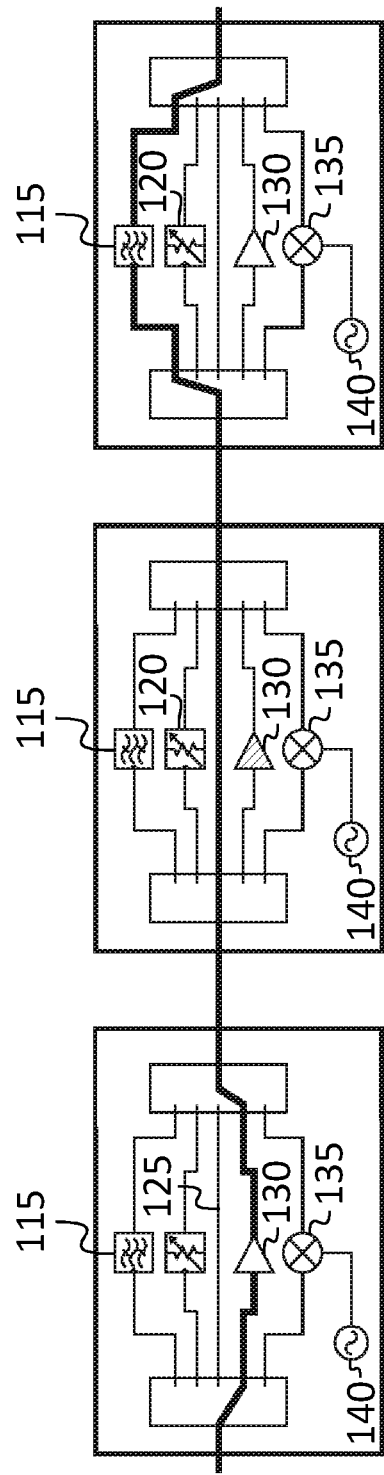
FIG. 15B is a schematic diagram of a cascade of three radio frequency cells, according to an embodiment of the present invention.

As mentioned above, in some embodiments a circuit constructed from cells 100 of the kind illustrated in FIG. 1 or from cells 100 of the kind illustrated in FIG. 13A may be reconfigured, when an element fails, to resume operating with a different configuration that bypasses the failed element. This feature may be referred to as a "self-healing" feature. Referring to FIG. 15A, in a cascade of three cells 100 of the kind illustrated in FIG. 1, if the cells are configured to form a cascade of an amplifier 130 in the second cell 100 of the cascade of cells, followed by a bandpass filter 115 in the third cell 100 of the cascade of cells, and if the amplifier 130 fails, the circuit may be reconfigured, e.g., by a control FPGA 220, to form instead the circuit of FIG. 15B, which also forms a cascade of an amplifier 130 followed by a bandpass filter 115, with the amplifier 130 being an amplifier 130 in the first cell 100 of the cascade of cells, instead of (as in the configuration of FIG. 15A) an amplifier 130 in the second cell 100 of the cascade of cells. In the second cell 100 of the cascade of cells the signal may follow the through path 125, bypassing the failed amplifier 130 in the second cell 100 of the cascade of cells. Accordingly, the circuit may resume operation as a result of changes in the settings of the input switches 105 and changes in the settings of the output switches 110 of the cascaded cells 100.

Figure 16:
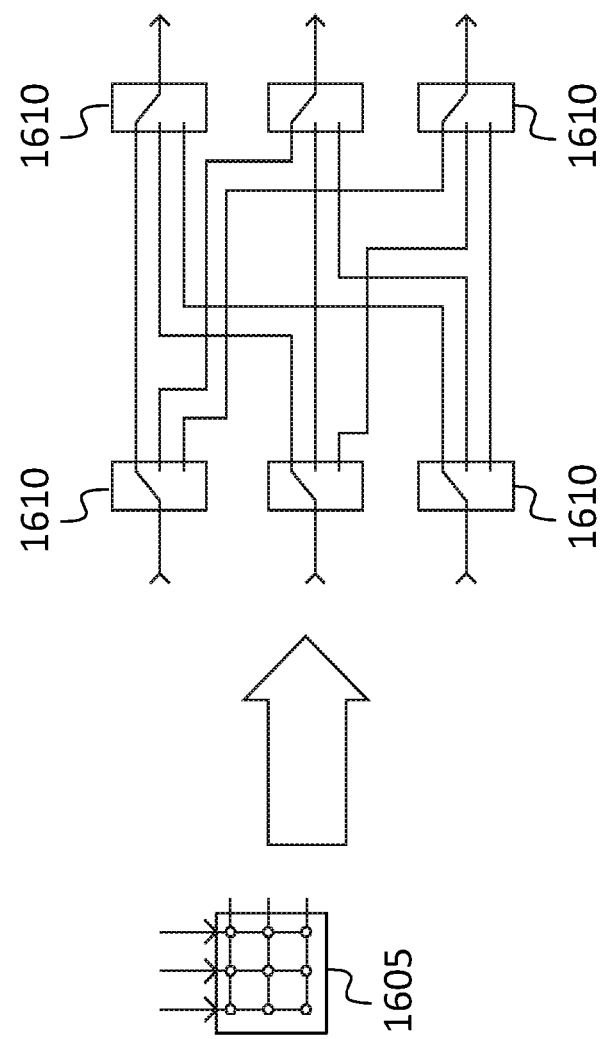
FIG. 16 is a schematic diagram of a 3×3 cross-bar switch and of an implementation of a 3×3 cross-bar switch, according to an embodiment of the present invention.

In some embodiments, a cross-bar switch is constructed from a plurality of single-pole N-throw switches. For example, referring to FIG. 16, a 3×3 cross-bar switch 1605 may be constructed from six single-pole 3-throw switches 1610 as shown. In another embodiment, a 5×5 cross-bar switch may be constructed from ten single-pole 5-throw switches in an analogous manner.

The single-pole N-throw switches may terminate unused connections. For example an HMC641LC4 single-pole 4-throw switch (available from Analog Devices, www.analog.com), may be fabricated as a common conductor connected to the common terminal of the switch, and four single-pole double-throw switches each connecting a respective terminal of the 4 other terminals of the single-pole 4-throw switch either to the common conductor of the single-pole 4-throw switch (with only one of the other terminals at a time being connected to the common conductor of the single-pole 4-throw switch) or to a 50-ohm termination to ground. The use of a switch that terminates unused connections may help to prevent cross talk between the plurality of signal paths in a system including one or more cells 100 of the kind illustrated in FIG. 1 or one or more cells 100 of the kind illustrated in FIG. 13A. It may also help to prevent oscillations that otherwise may occur as a result of an unterminated connection at an end of a transmission line when an amplifier is connected to (e.g., driving) the transmission line.

A single-pole N-throw switch may be constructed from a plurality of single pole switches each having fewer than N throws. For example, a single-pole 4-throw switch may be combined with a single-pole double-throw switch to form a composite single-pole 5-throw switch. To construct such a circuit, the common terminal of the single-pole double-throw switch may act as the common terminal of the composite single-pole 5-throw switch. A first one of the other two terminals of the single-pole double-throw switch may act as one of the 5 other terminals of the composite single-pole 5-throw switch. The second other terminal of the single-pole double-throw switch may be connected to the common terminal of the single-pole 4-throw switch, and the four other terminals of the single-pole 4-throw switch may act as the remaining other terminals of the composite single-pole 5-throw switch.

Figure 17A:
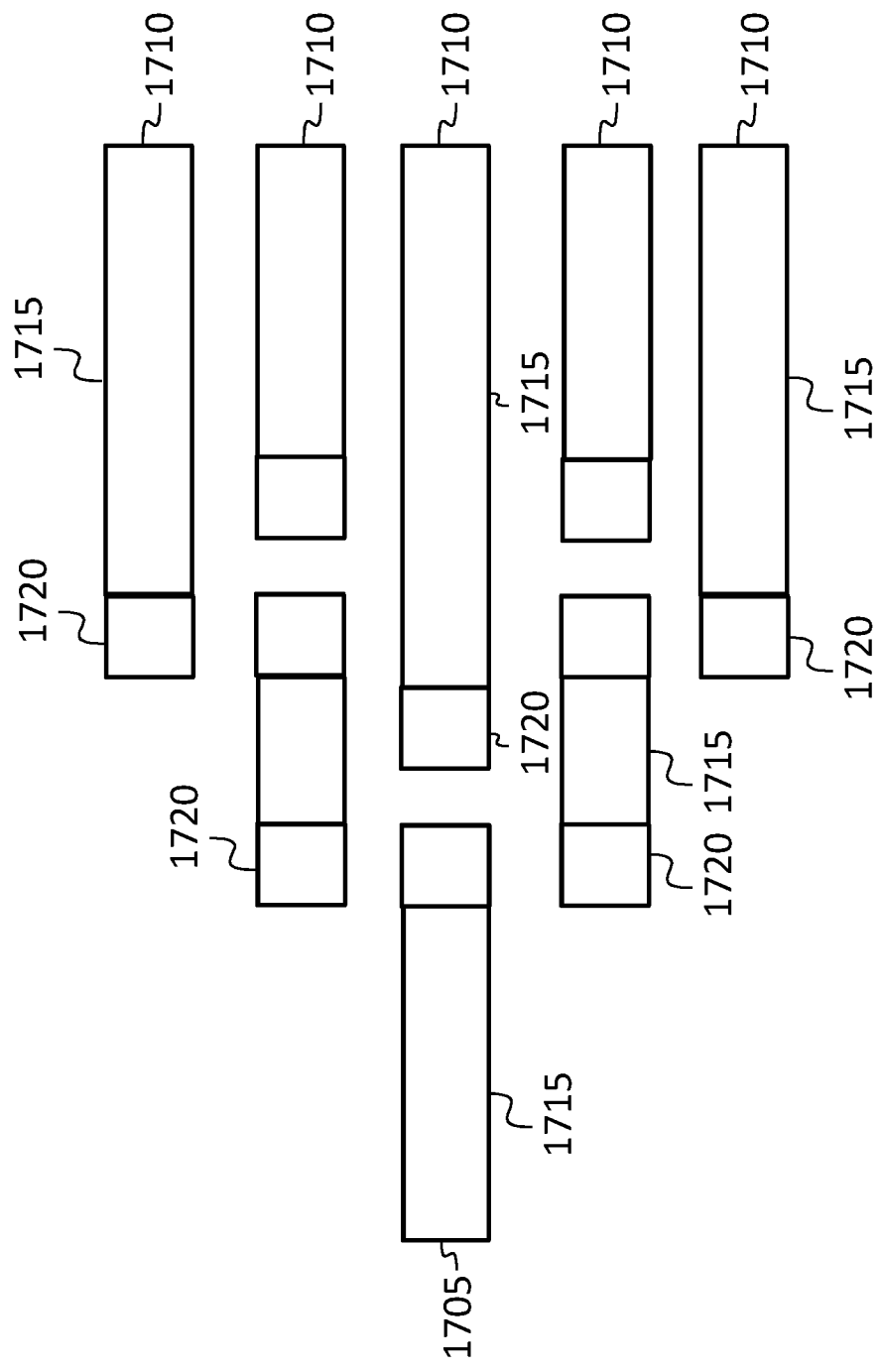
FIG. 17A is a layout diagram of a portion of a single-pole 5-throw pseudo-switch, according to an embodiment of the present invention.

In some embodiments some or all of the switches may be implemented as circuits including optional or "do not install" (DNI) capacitors. FIG. 17A shows a circuit printed wiring board pattern that may be used to implement a circuit, referred to herein as a "pseudo-switch", that has a "common" terminal 1705 and five "other" terminals 1710, and that may be used in place of a single-pole 5-throw switch. As used herein, a "pseudo-switch" is a switch implemented using capacitors (or low-resistance resistors) which may be selectively installed to establish a conductive path, and the "setting" of a pseudo-switch is a configuration in which one or more capacitors (or low-resistance resistors) are installed to form an RF signal path between the common terminal of the switch and one of the other terminals (or, in the case of a cross-bar switch, between a first terminal and a second terminal of the cross-bar switch). FIG. 17A shows a partially constructed circuit in which no capacitors have been installed, and the common terminal 1705 is not connected to any of the other terminals 1710. Microstrip transmission lines 1715 formed as conductive traces over a ground plane terminate in solder pads 1720 (the solder pads being portions of the conductive traces that are not covered by solder mask). Such pseudo-switches may be used as input and/or output switches either in embodiments according to FIG. 1 or in embodiments according to FIG. 13A.

Figure 17B:
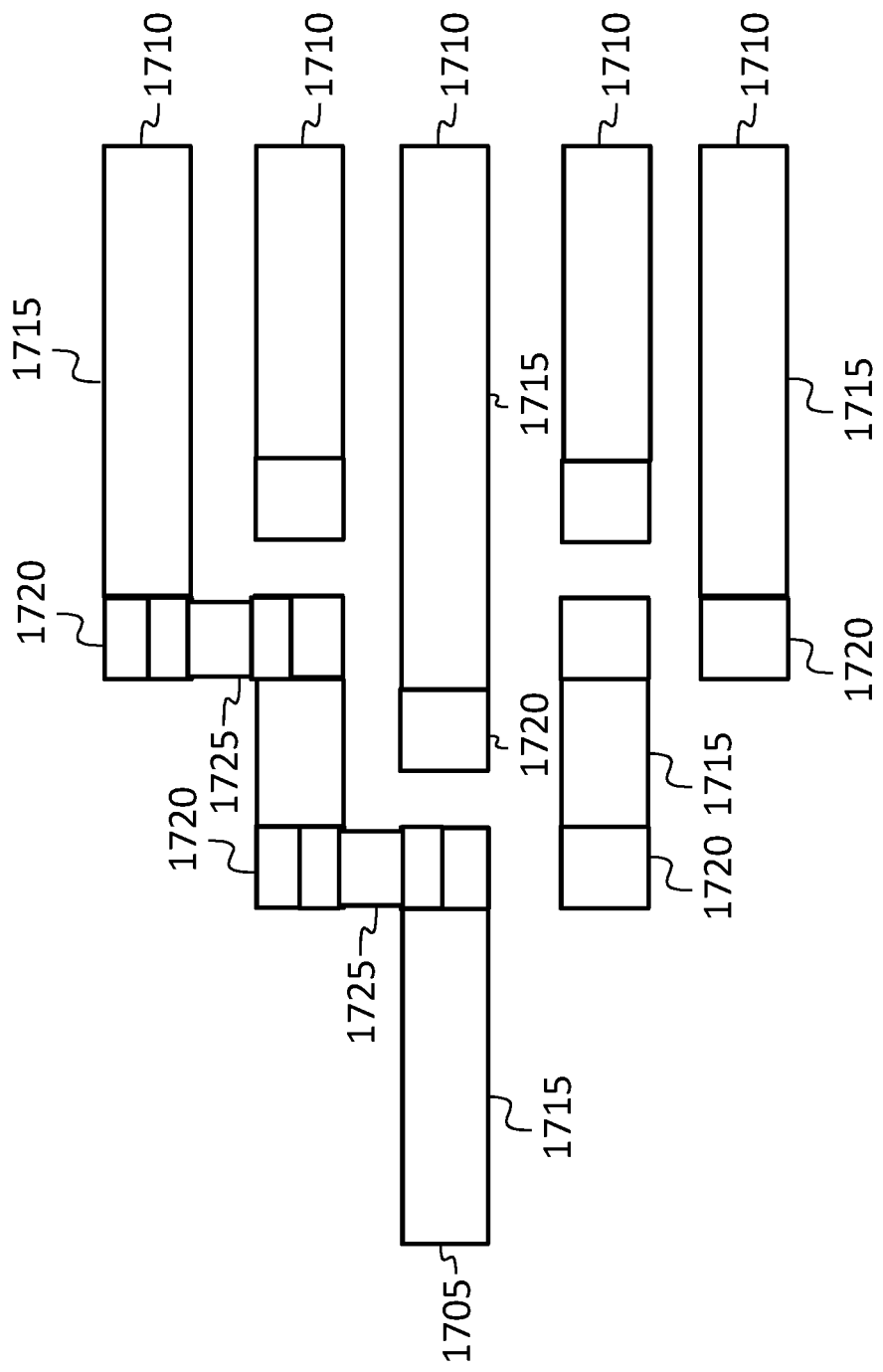
FIG. 17B is a layout diagram of a single-pole 5-throw pseudo-switch, according to an embodiment of the present invention.
Figure 17C:
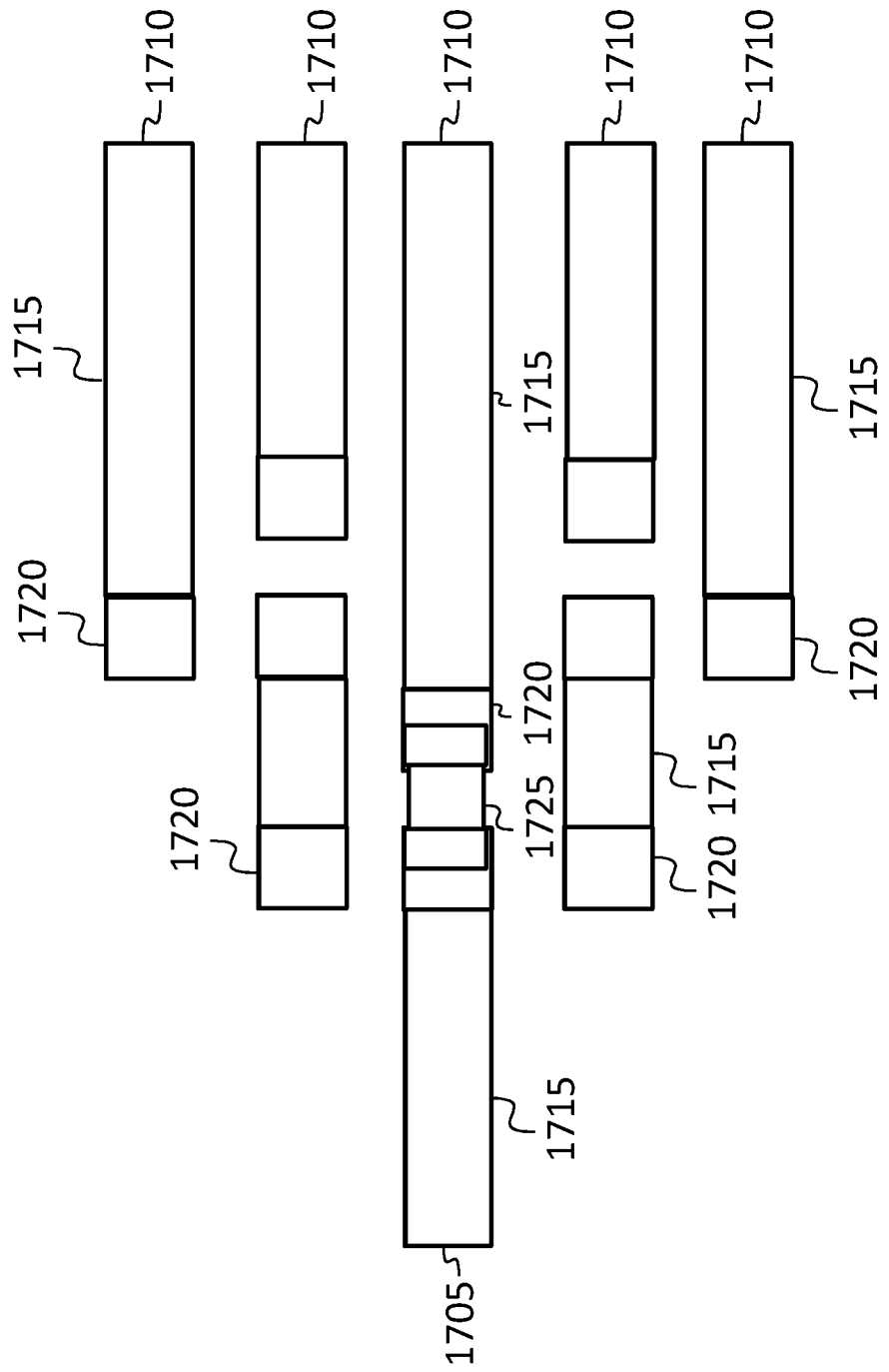
FIG. 17C is a layout diagram of a single-pole 5-throw pseudo-switch, according to an embodiment of the present invention.

FIG. 17B shows a single-pole 5-throw pseudo-switch with two capacitors 1725 (e.g., a surface-mount or "chip" capacitor) installed so as to form a connection between the common terminal 1705 and a first one of the other terminals 1710. FIG. 17C shows a single-pole 5-throw switch pseudo-switch with one capacitor 1725 installed so as to form a connection between the common terminal 1705 and a third one of the other terminals 1710. A plurality of single-pole, N-throw pseudo-switches of the kind illustrated in FIGS. 17B and 17C may be combined (in the manner shown in FIG. 16, or in a manner analogous to that shown in FIG. 16) to form an N×N cross-bar pseudo-switch.

If one or more pseudo-switches (e.g., of the kind illustrated in FIGS. 17B and 17C) are used, instead of electronically controllable switches, in cells 100 of the kind illustrated in FIG. 1 or one or more cells 100 of the kind illustrated in FIG. 13A, then the routing of signals through the cells may not be electronically controllable (e.g., by an FPGA) as discussed above, for example in the context of FIG. 2. Instead the routing of signals may be controlled by the installation (e.g., soldering in place) of capacitors 1725, or the routing of signals may be changed (e.g., to bypass a failed component, or to implement a different cascade) by a combination of the removal of previously installed capacitors 1725 (e.g., by de-soldering) and the installation (e.g., soldering in place) of capacitors 1725 in other positions in the pseudo-switch. As mentioned above, the use of a pseudo-switch instead of a switch may reduce the loss that a switch (e.g., a switch constructed using transistors) may introduce, if an electronically controlled switch is used.

Although limited embodiments of a software-configurable multi-function RF module have been specifically described and illustrated herein, many modifications and variations will be apparent to those skilled in the art. Accordingly, it is to be understood that a software-configurable multi-function RF module employed according to principles of this invention may be embodied other than as specifically described herein. The invention is also defined in the following claims, and equivalents thereof.

What is claimed is:
1. A system, comprising:
a first radio frequency cell;
a second radio frequency cell;
a third radio frequency cell; and
a fourth radio frequency cell;
one of the radio frequency cells comprising:
  an input switch;
  an output switch;
  a first element, the first element being a member of a first functional group;
  a second element, the second element being a member of a second functional group; and
  a third element, the third element being a member of a third functional group,
  each of the radio frequency cells comprising an input switch and an output switch, the input switch and the output switch of each of the radio frequency cells being configured, depending on their respective settings, to cause a radio frequency signal path from an input of the radio frequency cell to an output of the radio frequency cell to include one of the first element, the second element, and the third element, each of the first functional group, the second functional group, and the third functional group, being a different group selected from the set consisting of: filters, amplifiers, mixers, frequency multipliers, attenuators, and through paths,
the input switch of each of the radio frequency cells comprising a switch with at least three throws, and
the output switch of each of the radio frequency cells comprising a switch with at least three throws,
the first radio frequency cell, the second radio frequency cell, the third radio frequency cell, and the fourth radio frequency cell being connected in a cascade,
wherein:
the first element of the first radio frequency cell is a bandpass filter,
the second element of the first radio frequency cell is an attenuator,
the third element of the first radio frequency cell is a through path, and
the first radio frequency cell further comprises:
a fourth element, the fourth element being an amplifier; and
a fifth element, the fifth element being a mixer, and
the input switch and the output switch of the first radio frequency cell are further configured, depending on their respective settings, to cause the radio frequency signal path from the input of the first radio frequency cell to the output of the first radio frequency cell to include one of the fourth element, and the fifth element,
the system further comprising:
a field programmable gate array connected to, and configured to control, the input switch and the output switch of each of the radio frequency cells; and
one or more power detectors each connected to:
a respective output of one or more of the radio frequency cells, and
the field programmable gate array,
wherein the field programmable gate array is configured to detect failure of an element of the radio frequency cells, and, in response to detecting a failed element, to control the input switch and the output switch of the radio frequency cell including the failed element to cause the radio frequency signal path from the input of the radio frequency cell to the output of the radio frequency cell to bypass the failed element.

2. The system of claim 1, wherein a radio frequency cell of the first radio frequency cell, the second radio frequency cell, and the third radio frequency cell further comprises a phase locked loop having an input connected to a reference input of the radio frequency cell and an output connected to a local oscillator input of the mixer, wherein the phase locked loop has a digital control input for controlling a ratio of:
a frequency at the output of the phase locked loop, to
a frequency at the input of the phase locked loop,
the field programmable gate array being connected to, and configured to control, the phase locked loop.

3. The system of claim 1, wherein the bandpass filter of the first radio frequency cell has a digital control input for controlling a passband center frequency of the bandpass filter, and
the field programmable gate array is connected to, and configured to control, the bandpass filter.

4. The system of claim 1, further comprising a frequency reference,
wherein the frequency reference is connected to a respective reference input of each of two of the radio frequency cells.

5. The system of claim 1, wherein:
the first element of the second radio frequency cell is a bandpass filter,
the first element of the third radio frequency cell is a bandpass filter,
the bandpass filter of the first radio frequency cell has a first passband center frequency,
the bandpass filter of the second radio frequency cell has a second passband center frequency, and
the bandpass filter of the third radio frequency cell has a third passband center frequency,
the first, second, and third passband center frequencies all being different.

6. The system of claim 1, wherein the first radio frequency cell, the second radio frequency cell, and the third radio frequency cell are installed on, and connected to, a single printed circuit board.

7. The system of claim 1, further comprising a power supply connected to, and configured to provide DC power to, each of the first radio frequency cell, the second radio frequency cell, and the third radio frequency cell.

8. The system of claim 1, wherein the attenuator of the first radio frequency cell has a digital control input for controlling the attenuation of the attenuator.

9. The system of claim 1, wherein the bandpass filter of the first radio frequency cell has a digital control input for controlling the bandpass filter.

10. The system of claim 1, wherein the amplifier of the first radio frequency cell has a digital control input for controlling the gain of the amplifier.

11. The system of claim 1, wherein one of the radio frequency cells further comprises a phase locked loop having a reference input connected to a reference input of the radio frequency cell and an output connected to a local oscillator input of the mixer of the radio frequency cell.

12. The system of claim 1, wherein a switch of the input switch and the output switch comprises a plurality of conductive traces and a plurality of pairs of solder pads, each pair comprising two solder pads separated by a distance corresponding to a separation between contacts of a surface-mount component, each of the solder pads being connected to one of the conductive traces, the conductive traces and solder pads being configured to establish, upon installation of a conductive component or capacitor across one of the pairs of solder pads, a radio frequency signal path corresponding to a setting of the switch.

13. The system of claim 3, wherein the bandpass filter is a switched filter bank.

14. The system of claim 9 wherein a passband center frequency of the bandpass filter is controllable through the digital control input.

15. The system of claim 9 wherein a bandwidth of the bandpass filter is controllable through the digital control input.

16. The system of claim 9 wherein an order of the bandpass filter is controllable through the digital control input.

17. The system of claim 11, wherein the phase locked loop has a digital control input for controlling the ratio of:
a frequency at the output of the phase locked loop, to
a frequency at the input of the phase locked loop.

18. A system, comprising:
a first radio frequency cell;
a second radio frequency cell;

third radio frequency cell; and
a fourth radio frequency cell;
one of the radio frequency cells comprising:
an input switch;
an output switch;
a first element, the first element being a member of a first functional group;
a second element, the second element being a member of a second functional group; and
a third element, the third element being a member of a third functional group,
each of the radio frequency cells comprising an input switch and an output switch, the input switch and the output switch of each of the radio frequency cells being configured, depending on their respective settings, to cause a radio frequency signal path from an input of the radio frequency cell to an output of the radio frequency cell to include one of the first element, the second element, and the third element,
each of the first functional group, the second functional group, and the third functional group, being a different group selected from the set consisting of: filters, amplifiers, mixers, frequency multipliers, attenuators, and through paths,
the input switch of each of the radio frequency cells being a cross-bar switch and the output switch of each of the radio frequency cells being a crossbar switch, each of the radio frequency cells further comprising a direct conductive connection from a terminal of the output switch to a terminal of the input switch, each of the radio frequency cells further comprising a direct conductive connection from a terminal of the output switch to a terminal of the input switch,
the first radio frequency cell, the second radio frequency cell, the third radio frequency cell, and the fourth radio frequency cell being connected in a cascade,
wherein:
the first element of the first radio frequency cell is a bandpass filter, the second element of the first radio frequency cell is an attenuator, the third element of the first radio frequency cell is a through path, and the first radio frequency cell further comprises:
a fourth element, the fourth element being an amplifier; and
a fifth element, the fifth element being a mixer, and the input switch and the output switch of the first radio frequency cell are further configured, depending on their respective settings, to cause the radio frequency signal path from the input of the first radio frequency cell to the output of the first radio frequency cell to include one of the fourth element, and the fifth element, the system further comprising:
a field programmable gate array connected to, and configured to control, the input switch and the output switch of each of the radio frequency cells; and
one or more power detectors each connected to:
a respective output of one or more of the radio frequency cells, and the field programmable gate array, wherein the field programmable gate array is configured to detect failure of an element of the radio frequency cells, and, in response to detecting a failed element, to control the input switch and the output switch of the radio frequency cell including the failed element to cause the radio frequency signal path from the input of the radio frequency cell to the output of the radio frequency cell to bypass the failed element.

19. The system of claim 18, wherein the input switch and the output switch are configured to cause a radio frequency signal path from the input of the radio frequency cell to the output of the radio frequency cell to include, in order:
one of the first element, the second element, and the third element;
the direct conductive connection; and
another one of the first element, the second element, and the third element.

20. The system of claim 18, wherein:
the input switch has a plurality of first terminals and a plurality of second terminals, and is controllable to connect each of the first terminals any of the second terminals;
the output switch has a plurality of first terminals and a plurality of second terminals, and is controllable to connect each of the first terminals any of the second terminals;
three of the second terminals of the input switch are connected, respectively, to the first element, the second element, and the third element;
three of the second terminals of the output switch are connected, respectively, to the first element, the second element, and the third element; and
at least one of the first terminals of the input switch is connected to one of the first terminals of the output switch.

* * * * *